(12) United States Patent
Koyama et al.

(10) Patent No.: US 8,353,102 B2
(45) Date of Patent: Jan. 15, 2013

(54) WIRING BOARD CONNECTION METHOD

(75) Inventors: Masayoshi Koyama, Osaka (JP);
Tsukasa Shiraishi, Osaka (JP)

(73) Assignee: Panasonic Corporation, Osaka (JP)

( * ) Notice: Subject to any disclaimer, the term of this patent is extended or adjusted under 35 U.S.C. 154(b) by 848 days.

(21) Appl. No.: 12/120,864

(22) Filed: May 15, 2008

(65) Prior Publication Data
US 2008/0283284 A1 Nov. 20, 2008

(30) Foreign Application Priority Data
May 16, 2007 (JP) .................................. 2007-130744

(51) Int. Cl.
H05K 3/34 (2006.01)
H05K 3/30 (2006.01)
H05K 1/00 (2006.01)
(52) U.S. Cl. ............................. 29/840; 29/832; 174/250
(58) Field of Classification Search .................. 29/840, 29/825, 832, 842; 174/250, 251, 260, 261, 174/262; 361/792
See application file for complete search history.

(56) References Cited

U.S. PATENT DOCUMENTS

| | | | | |
|---|---|---|---|---|
| 5,539,243 A * | 7/1996 | Matsuki | ........................ | 257/584 |
| 5,726,489 A * | 3/1998 | Matsuda et al. | ................ | 257/659 |
| 5,749,997 A * | 5/1998 | Tang et al. | ...................... | 156/249 |
| 5,770,305 A * | 6/1998 | Terasaka | ........................ | 428/328 |
| 5,907,180 A * | 5/1999 | Johansson et al. | ............ | 257/580 |
| 6,029,125 A * | 2/2000 | Hagen et al. | ................... | 704/201 |
| 6,268,643 B1 * | 7/2001 | Russell | ........................ | 257/666 |
| 6,310,390 B1 * | 10/2001 | Moden | ......................... | 257/668 |
| 6,424,028 B1 * | 7/2002 | Dickinson | ................... | 257/678 |
| 6,445,061 B2 * | 9/2002 | Corisis | ......................... | 257/666 |
| 6,712,129 B1 * | 3/2004 | Lee | ........................... | 165/104.21 |
| 6,831,353 B2 * | 12/2004 | Schoenfeld et al. | .......... | 257/676 |
| 7,038,327 B2 * | 5/2006 | Ho et al. | ....................... | 257/786 |
| 7,785,494 B2 * | 8/2010 | Yeh | ............................ | 252/500 |
| 2002/0111055 A1 * | 8/2002 | Matsumura et al. | ............ | 439/91 |
| 2005/0077545 A1 * | 4/2005 | Zhao et al. | ................... | 257/202 |

(Continued)

FOREIGN PATENT DOCUMENTS
EP 1 865 550 A1 12/2007
(Continued)

OTHER PUBLICATIONS

Japanese Office Action for Application No. 2007-130744, Sep. 6, 2011, Panasonic Corporation.

*Primary Examiner* — David Angwin
(74) *Attorney, Agent, or Firm* — RatnerPrestia

(57) ABSTRACT

A wiring board connection method comprising: arranging a continuous conductive joint body on adjacent connection terminals of one of the wiring boards in a space between the adjacent connection terminals on one of the wiring boards; aligning the wiring boards so that the connection terminals face each other with the conductive joint body interposed therebetween; and bonding the connection terminals with each other by heating and then cooling the conductive joint body, wherein: the conductive joint body is a material that generates air bubbles upon being heated; and a recessed portion is formed on a surface of at least one of the connection terminals, the surface being opposite to the connection terminal of another wiring board. When the connection terminals are bonded with each other, the conductive joint body is allowed to move so as to gather on the surfaces of the connection terminals where no recessed portions are formed.

12 Claims, 27 Drawing Sheets

U.S. PATENT DOCUMENTS

| | | | |
|---|---|---|---|
| 2005/0098902 A1* | 5/2005 | Ho et al. | 257/786 |
| 2005/0127531 A1* | 6/2005 | Tay et al. | 257/786 |
| 2005/0208707 A1* | 9/2005 | Kim et al. | 438/113 |
| 2005/0269699 A1* | 12/2005 | Haw et al. | 257/737 |
| 2006/0028288 A1* | 2/2006 | Langhorn et al. | 333/22 R |
| 2006/0131729 A1* | 6/2006 | Lee | 257/700 |
| 2006/0180912 A1* | 8/2006 | Michaels et al. | 257/686 |
| 2006/0202335 A1* | 9/2006 | Mu | 257/738 |
| 2007/0001297 A1* | 1/2007 | Higasa et al. | 257/723 |
| 2007/0215273 A1* | 9/2007 | Jacobs | 156/297 |
| 2008/0120832 A1* | 5/2008 | Kawamura et al. | 29/843 |

FOREIGN PATENT DOCUMENTS

| | | |
|---|---|---|
| JP | 07-230100 A | 8/1995 |
| JP | 2005-252252 A | 9/2005 |
| WO | WO 2006/103949 A1 | 10/2006 |

* cited by examiner

FIG.5

| CONDUCTIVE PARTICLES | MELTING POINT (SOLIDUS LINE) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG.6

| AIR BUBBLE GENERATING AGENT | BOILING POINT (°C) | AIR BUBBLE GENERATING AGENT | BOILING POINT (°C) |
|---|---|---|---|
| HEXANE | 69 | DIMETHYLAMINE HYDROCHLORIDE | 171 |
| VINYL ACETATE | 72 | DIMETHYL SULFOXIDE (DMSO) | 189 |
| ISOPROPYL ALCOHOL | 83 | ETHYLENE GLYCOL | 198 |
| WATER | 100 | N-METHYL-2-PYRROLIDONE (NMP) | 204 |
| 1,4-DIOXANE | 101 | ALPHA-TERPINEOL | 218 |
| BUTYL ACETATE | 126 | BUTYL CARBITOL | 231 |
| PROPIONIC ACID | 141 | BUTYL CARBITOL ACETATE | 246 |

FIG.7

| AIR BUBBLE GENERATING AGENT | DECOMPOSITION TEMPERATURE (°C) |
|---|---|
| BORIC ACID | 70~ |
| AMMONIUM METABORATE | 120~ |
| SODIUM HYDROGEN CARBONATE | 120-150 |
| 4,4'-OXYBIS (BENZENESULFONYL HYDRAZIDE) (OBSH) | 155-165 |
| AZODICARBONAMIDE (ADCA) | 197-210 |
| BARIUM METABORATE | 200~ |
| N,N'-DINITROSOPENTA-METHYLENETETRAMINE (DPT) | 200-250 |
| ALUMINUM HYDROXIDE | 230 |
| CALCIUM ALUMINATE | 230 |
| DAWSONITE | 230 |

WIRING BOARD CONNECTION METHOD

BACKGROUND OF THE INVENTION

1. Field of the Invention

The present invention relates to a wiring board connection method which electrically connects a wiring board and a wiring board, and a wiring board used in the method.

2. Related Art of the Invention

In flip-chip mounting where electronic components are mounted on a substrate, bumps are formed on wiring terminals. In recent years, as a technique for forming bumps on wiring terminals, a method in which bumps are formed by making conductive particles (for example, solder powders) self-assemble on wiring terminals, or a method in which flip-chip mounting is conducted by making conductive particles self-assemble between electrodes of a wiring board and a semiconductor chip to form a connection body between the electrodes has been proposed (for example, see International Publication No. WO2006/103949), other than conventional techniques such as solder pasting and super soldering.

FIGS. 16(A) to 16(D) and FIGS. 17(A) to 17(D) are diagrams for describing a bump formation technique in which conductive particles are made to self-assemble.

First, as shown in FIG. 16(A), a resin 114 containing solder powders 116 and an air bubble generating agent (not shown) is supplied on a substrate 31 having a plurality of pad electrodes 32. Next, as shown in FIG. 16(B), a flat plate 140 is arranged on a surface of the resin 114.

Heating the resin 114 in this state, as shown in FIG. 16(C), air bubbles 30 are generated from the air bubble generating agent contained in the resin 114. Then, as shown in FIG. 16(D), the resin 114 is forced out from the area where the air bubbles exist, as a result of the generated air bubbles 30 growing.

The forced-out resin 114, as shown in FIG. 17(A), is self-gathered in the shape of columns on its interfaces with the pad electrodes 32 of the substrate 31 and on its interface with the flat plate 140. A part of the resin 114 that exists at the edge of the substrate 31 will be forced out from the outer edge of the substrate 31 (the drawing omitted).

Then, further heating the resin 114, as shown in FIG. 17(B), the solder powders 116 contained in the resin 114 are molten, and solder powders 116 contained in the resin 114 self-gathered on each pad electrode 32 are melt-bonded together.

Since the pad electrodes 32 have a high wettability for the melt-bonded solder powders 116, as shown in FIG. 17(C), a bump 19 consisting of the molten solder powders is formed on each pad electrode 32. Finally, as shown in FIG. 17(D), the resin 114 and the flat plate 140 are removed, thereby obtaining the substrate 31 with the bumps 19 formed on the pad electrodes 32. In the aforementioned process, the amount of the supplied resin 114 is shown with exaggeration, and in reality, an amount of resin 114 suitable for self-gathering on the pad electrodes 32 and determined by considering errors is supplied.

The characteristics of this method lie in heating the resin 114 supplied in a gap between the substrate 31 and the flat plate 140 to generate the air bubbles 30 from the air bubble generating agent, and as a result of the air bubbles 30 growing, the resin 114 being forced out of the area where the air bubbles exist, thereby making the resin 114 self-gather between the pad electrodes 32 of the substrate 31 and the flat plate 140, with the solder powders 116 kept contained in the resin 114.

The phenomenon that the resin 114 self-gathers on the pad electrodes 32 can be considered as occurring in a mechanism shown in FIGS. 18(A) and 18(B).

FIG. 18(A) is a diagram indicating the state in which the resin 114 is forced out onto a pad electrode 32 of the substrate 31 by the grown air bubbles (not shown). Since the resin 114 that is in contact with the pad electrode 32 has a force Fs corresponding to an interfacial tension (what is called a force resulting from the resin wet spreading) at the interface, which is larger than stress $F\eta$ generated from the viscosity $\eta$ of the resin, the resin 114 spreads over the entire surface of the pad electrode 32, and finally, the column-shaped resin with the end of the pad electrode 32 as its boundary is formed between the pad electrode 32 and the flat plate 140.

Although stress Fb generated due to the growth (or movement) of the bubbles 30 is applied to the column-shaped resin 114 formed as a result of self-gathering on the pad electrode 32, as shown in FIG. 18(B), the shape of the resin 114 can be maintained by the effect of the stress $F\eta$ generated due to the viscosity $\eta$ of the resin 114, and the resin 114 will not disappear once it has self-gathered.

Here, whether or not the self-gathered resin 114 can maintain a certain shape also depends on the area S of the pad electrode 32, the length L of the gap between the pad electrode 32 and the flat plate 140, and the viscosity $\eta$ of the resin 114 in addition to the aforementioned force Fs corresponding to interfacial tension Fs. Where the measure for maintaining the resin 114 in a certain shape is T, it is possible to consider the following relationship to be established qualitatively.

[Formula 1]

$$T=K\cdot(S/L)\cdot\eta\cdot Fs \quad (K \text{ is a constant.})$$

As described above, in this method, the resin 114 is formed on the pad electrode 32 in a self-adjusting manner using self-gathering of the resin 114 due to its interfacial tension, but since the pad electrode 32 formed on the substrate 31 surface is formed in the shape of a protrusion, that self-gathering due to the interfacial tension can be considered to be one using a phenomenon occurring in the gap between the flat plate 140 and the pad electrode 32, which is narrower than the gap between the substrate 31 and the flat plate 140, from among the gap formed between the substrate 31 and the flat plate 140.

Using the aforementioned method, it is possible to make the solder powders dispersed in the resin 114 efficiently self-assemble on the electrode, and also to form bumps with an excellent uniformity and a high productivity. Furthermore, since it is possible to make the solder powders dispersed in the resin impartially self-assemble on a plurality of electrodes on the substrate supplied with the resin, the aforementioned method is useful especially when forming bumps at a time on all of the electrodes on the wiring board supplied with the resin.

The aforementioned technique of making the solder powders self-assemble on the electrodes by making the resin self-gather can be used not only for bump formation, but also for other usages.

As one of the other usages, the present inventors have conceived the use of that technique for connecting substrates.

In particular, for the internal wiring of electronic devices such as mobile phones and digital cameras, thin and foldable flexible print circuit boards (hereinafter, referred to as "FPC(s)") are often used. In recent years, with the downsizing of mobile devices and the increase of movable units, the use proportion of the FPCs has been increasing. When an FPC is connected to a hard substrate used for a main board, it is common to use a connector for that connection, which provides a great advantage in that the FPC can be detached and attached repeatedly. Even though there is no need for detachment and attachment, there is an advantage in achieving easy substrate-to-substrate connection. However, the three-dimensional space occupied by the connector may hinder the provision of downsized and thinned devices. In addition, the predominant minimum pitch for the existing connectors is 0.3 mm, and it is difficult to perform electrode terminal connection with a pitch narrower than that predominant minimum pitch.

Meanwhile, a rigid-flex circuit board in which a hard substrate and an FPC are completely integrated exists. Although a rigid-flex circuit board has an advantage in not requiring a connection unit at its outer periphery because the FPC is interposed between internal layers of the hard substrate, a long manufacturing process is required and especially, where a combination of hard substrates with different numbers of layers is used, the process becomes complicated.

In these circumstances, recently, a wiring board having a structure equivalent to that of a rigid-flex circuit board can be manufactured by connecting different hard substrates via an FPC. This makes it possible to simplify the process compared to that for a rigid-flex circuit board, and provides less limitation of the outer shape and structure of the wiring board.

Accordingly, the use of the aforementioned technique can be considered to be effective for connecting wiring boards each having such narrow-pitch electrode terminals.

Meanwhile, the present inventors also discovered the following phenomenon when considering a method which connects wiring boards applying the aforementioned method. The phenomenon will be described below.

FIG. 19 shows a wiring board used for considering that connection. On a wiring board 31a, connection terminals 34a are formed in an area indicated by an arrow in the Figure by providing a plurality of strip-shaped wiring lines 33a. The width of each wiring line 33a is 0.05 mm, and the space 35a between adjacent wiring lines is 0.05 mm, and thus the wiring rule is one for a pitch of 0.1 mm. On a center portion of each connection terminal 34a on the wiring board 31a shown in FIG. 19, a proper amount of resin 114 containing solder powders and an air bubble generating agent (not shown) is applied.

Next, FIG. 20(A) shows a state in which another wiring board 31b is superposed on the wiring board 31a. FIG. 20(B) is a cross-sectional view of FIG. 20(A) taken along a straight line A-A. On the wiring board 31b, wiring lines 33b are arranged with the same dimensions as those of the wiring board 31a, and the respective connection terminals 34a and connection terminals 34b face each other, and overlap each other. Heating the applied resin 114 in this state, it can be expected to connect the wiring board 31a and the wiring board 31b as a result of the solder powders self-assembling in the area where the connection terminals 34a and the connection terminals 34b overlapping each other and then being molten and solidified.

However, when the heating is conducted in reality, as shown in FIG. 21(A), the resin 114 and the solder powders largely have moved up to the outside of the area where the connection terminals 34a and 34b overlap each other. Especially, the movement of the resin 114 and the solder powders to the spaces 35a and spaces 35b adjacent to the connection terminals 34a and 34b is significant.

FIG. 22 shows a state in which the moved and assembled solder powders have been molted and solidified. In an observation using an optical microscope, as a result of the moved solder powders being molten, regions 16a short-circuited with their respective neighboring connection terminals or regions 16b where the solder powders are assembled at the wiring lines outside the connection area although they have not yet caused short-circuiting have been observed. Furthermore, when performing an X-ray fluoroscopic observation, regions 16c having a shortage of solder and unconnected regions 16d have been observed in the connection terminals, and not all of the solder powders have assembled in the area where the connection terminals 34a and 34b overlap each other.

As described above, it has turned out that the aforementioned problems should be solved in order to connect wiring boards each having microscopic strip-shaped connection terminals by making conductive particles such as solder powders self-assemble on their electrodes.

SUMMARY OF THE INVENTION

The present invention has been made in view of the aforementioned problems, and an object of the present invention is to provide a wiring board connection method capable of connecting connection terminals in a favorable manner.

The $1^{st}$ aspect of the present invention is a wiring board connection method which connects wiring boards each having a strip-shaped connection terminal for connecting with another substrate, the method comprising:

aligning the wiring boards so that the connection terminals face each other with a conductive joint body interposed therebetween; and bonding the connection terminals with each other by heating and then cooling the conductive joint body, wherein:

the conductive joint body is a material that generates air bubbles upon being heated;

a plurality of the connection terminals are provided in each of the wiring boards; and a recessed portion is formed on a surface of at least one of the connection terminals in at least one of the wiring boards, the surface being opposite to the connection terminal of another wiring board.

The $2^{nd}$ aspect of the present invention is the wiring board connection method according to the $1^{st}$ aspect of the present invention, wherein, the recessed portion is formed as a groove.

The $3^{rd}$ aspect of the present invention is the wiring board connection method according to the $2^{nd}$ aspect of the present invention, wherein, the groove is formed extending across the connection terminal.

The $4^{th}$ aspect of the present invention is the wiring board connection method according to the $3^{rd}$ aspect of the present invention, wherein:

the groove has a depth reaching a surface of the wiring board; and the connection terminal is separated by the groove and is intermittently formed on the surface of the wiring board.

The $5^{th}$ aspect of the present invention is the wiring board connection method according to the $3^{rd}$ aspect of the present invention, wherein:

the groove has a depth not reaching a surface of the wiring board; and the connection terminal is continuously formed on the surface of the wiring board.

The $6^{th}$ aspect of the present invention is the wiring board connection method according to the $3^{rd}$ aspect of the present invention, wherein:

the groove is provided perpendicular to a longitudinal direction of the connection terminal; and in the aligned state, the groove in one of the opposing connection terminals and a part of the other of the opposing connection terminals in which the groove is not formed face each other.

The 7$^{th}$ aspect of the present invention is the wiring board connection method according to the 6$^{th}$ aspect of the present invention, wherein:

the groove is formed in each of the opposing connection terminals;

the groove is provided on each of the connection terminals at equal spaces, in the aligned state, a center line of at least one of the grooves in one of the opposing connection terminals and a center line of the part of the other of the opposing connection terminals interposed between at least two of the grooves correspond to each other.

The 8$^{th}$ aspect of the present invention is the wiring board connection method according to the 6$^{th}$ aspect of the present invention, wherein a width of the groove is shorter than a length of the part of the other connection terminal.

The 9$^{th}$ aspect of the present invention is the wiring board connection method according to the 7$^{th}$ aspect of the present invention, wherein a width of the groove is shorter than a length of the part of the other connection terminal.

The 10$^{th}$ aspect of the present invention is the wiring board connection method according to the 1$^{st}$ aspect of the present invention, wherein:

the conductive joint body is a fluid containing conductive particles and an air bubble generating agent; and the fluid contains a material that generates a gas as a result of boiling or thermally decomposing upon being heated.

The 11$^{th}$ aspect of the present invention is the wiring board connection method according to the 10$^{th}$ aspect of the present invention, wherein the alignment is conducted with a space between the wiring boards, the space being larger than a diameter of the conductive particles in the conductive joint body.

The 12$^{th}$ aspect of the present invention is the wiring board connection method according to the 1$^{st}$ aspect of the present invention, wherein the conductive joint body is an anisotropic conductive material.

The 13$^{th}$ aspect of the present invention is a wiring board comprising:

a plurality of strip-shaped connection terminals for connecting with another substrate via a conductive joint body that generates air bubbles upon being heated; and a recessed portion is formed on a surface of at least one of the connection terminals, the surface being opposite to the connection terminal of another substrate.

According to the present invention described above, it is possible to provide a wiring board connection method, etc., capable of connecting terminals in a favorable manner.

BRIEF DESCRIPTION OF THE DRAWINGS

FIG. 5 is a diagram illustrating example materials for conductive particles according to each embodiment of the present invention;

FIG. 6 is a diagram illustrating example materials for an air bubble generating agent according to each embodiment of the present invention;

FIG. 7 is a diagram illustrating example materials for air bubble generating agent powers according to each embodiment of the present invention;

Figure 1:
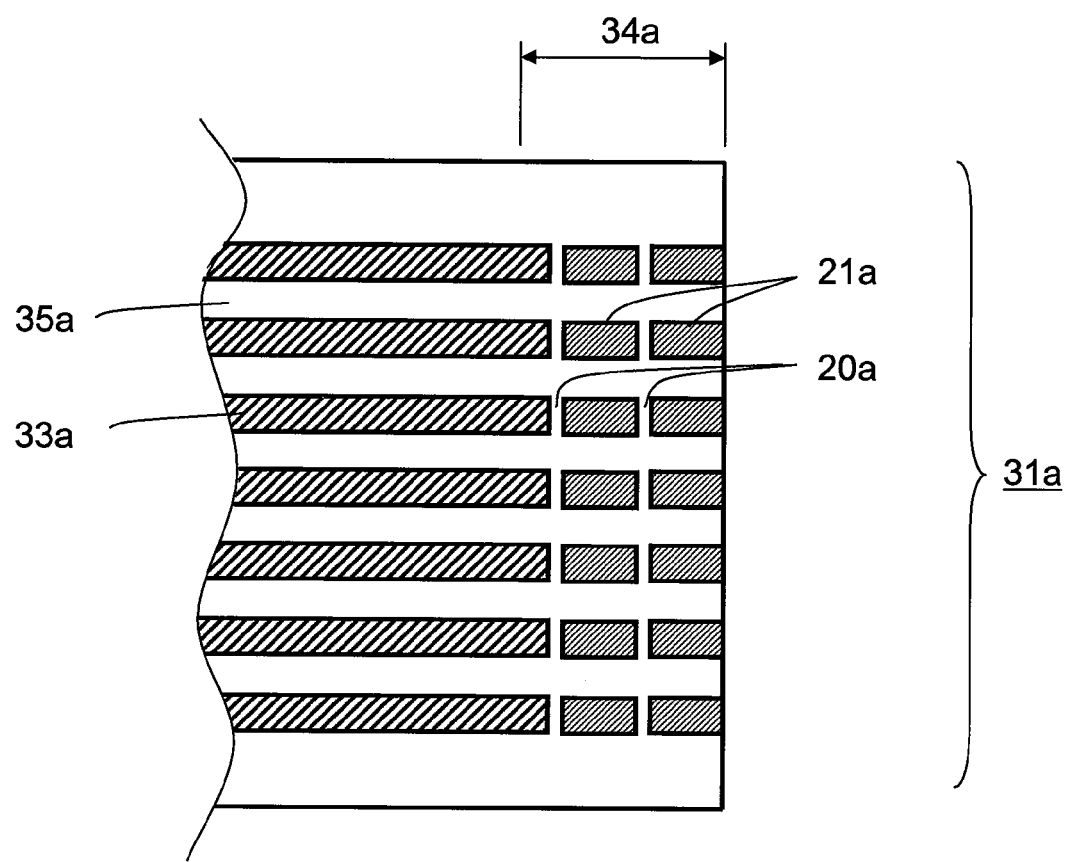
FIG. 1 is a configuration diagram of a wiring board used in a wiring board connection method according to embodiment 1 of the present invention.

DESCRIPTION OF SYMBOLS 14 fluid
16 conductive particles
20a, 20b groove
21a, 21b iindependent electrode
30 air bubble
31a, 31b wiring board
33a, 33b wiring line
34a, 34b connection terminal

PREFERRED EMBODIMENTS OF THE INVENTION

Hereinafter, embodiments of the present invention will be described with reference to the wings.
(Embodiment 1)

A wiring board according to embodiment 1 of the sent invention will be described with reference FIG. 1.

On a wiring board 31a, a plurality of wiring lines 33a are provided, and the area indicated by an arrow in the Figure is a connection terminal 34a formed of an end portion of the wiring line 33a, and the line length of the connection terminal 34a is 0.9 mm. The width of each wiring line 33a is 0.05 mm, and the width of a space 35a between adjacent wiring lines 33a is 0.05 mm. Accordingly, the wiring lines 33a are formed according to the wiring rule for a pitch of 0.1 mm.

The connection terminal 34a in each wiring line 33a is divided by grooves 20a perpendicular to the longitudinal direction of the connection terminal 34a, thereby forming independent electrodes 21a, which form an intermittent-line pattern.

The line length of each independent electrode 21a is 0.3 mm, and two independent electrodes 21a are formed within the area of a connection terminal 34a having a line length of 0.9 mm as a result of the division by grooves 20a with a width of 0.1 mm. However, this example is a mere example, and the present invention is not limited to these dimensions and shape. The line length, width or shape, or the quantity of the independent electrodes 21a, and the line length, width or shape of the grooves 20a can be determined in each case according to the wiring rule for the substrates to be connected and the connection conditions.

In the above configuration, the wiring board 31a or 31b corresponds to a wiring board according to the present invention, and each connection terminal 34a or 35b corresponds to a connection terminal according to the present invention, and each groove 20a or 20b corresponds to a groove according to the present invention.

Figure 2A:
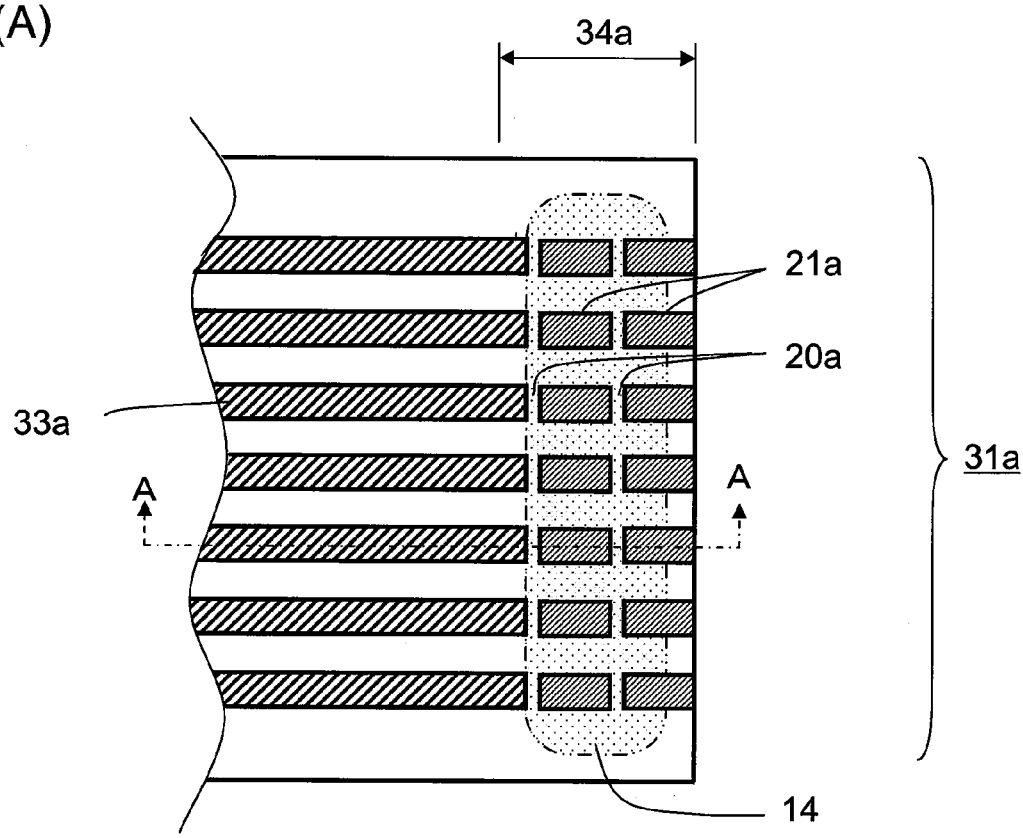
FIG. 2(A) is a plan view indicating a process for a wiring board connection method according to embodiment 1 of the present invention.
Figure 2B:
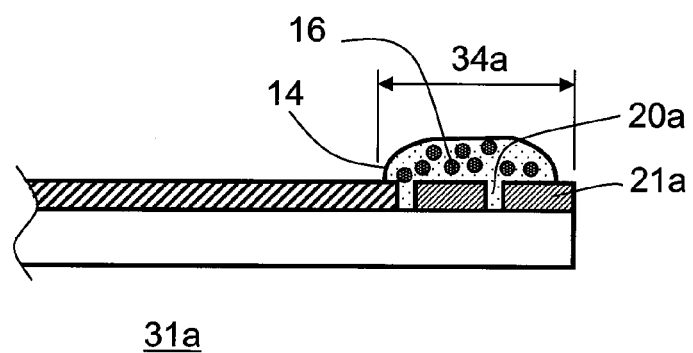
FIG. 2(B) is a cross-sectional view of FIG. 2(A) taken along a straight line A-A.

Next, as shown in FIG. 2(A), and FIG. 2(B), which is a cross-sectional view of FIG. 2(A) taken along a straight line A-A, a fluid 14 containing conductive particles 16 and an air bubble generating agent (not shown) is supplied on the connection terminals 34a including the independent electrodes 21a and the grooves 20a, which are provided in the wiring lines 33a of the wiring board 31a. For the fluid 14 according to embodiment 1, a resin is used. Specific examples of the conductive particles 16 and the air bubble generating agent will be detailed later.

Figure 3A:
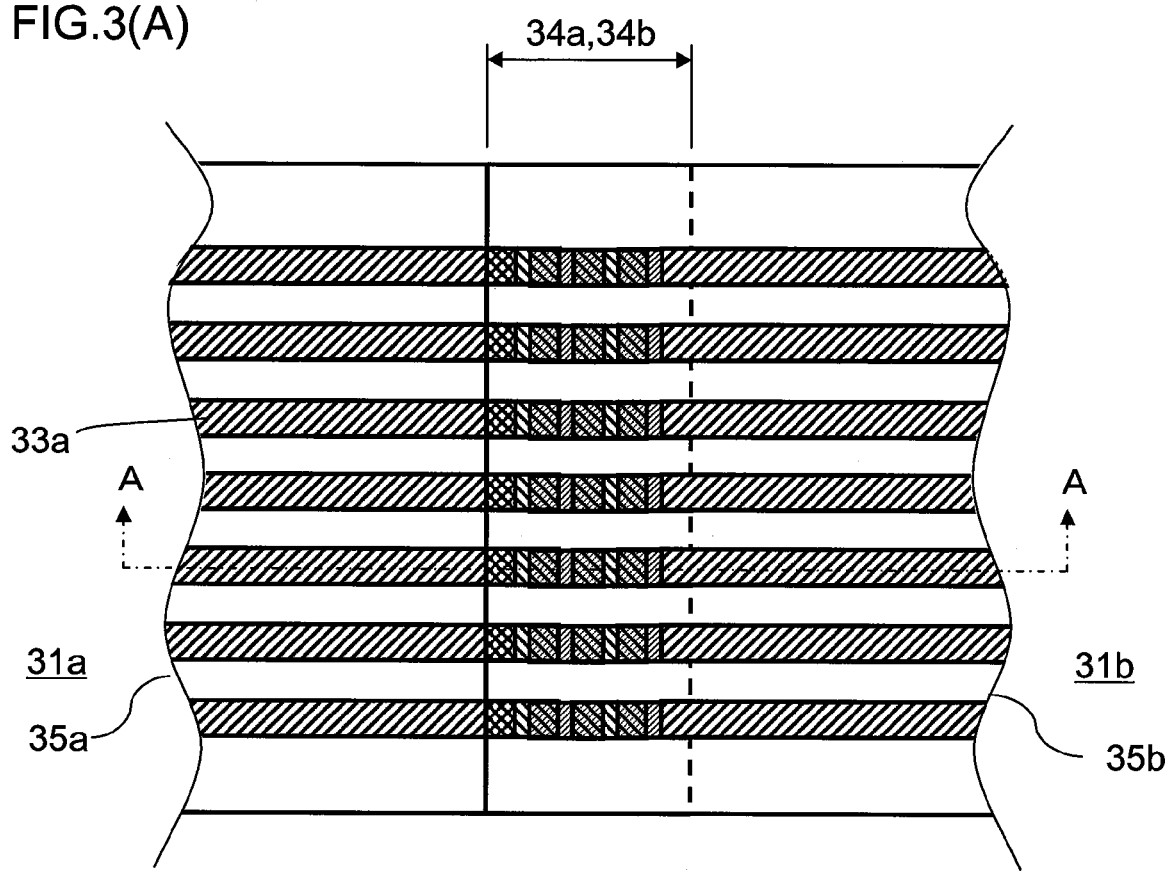
FIG. 3(A) is a plan view for describing a wiring board connection method according to embodiment 1 of the present invention.
Figure 3B:
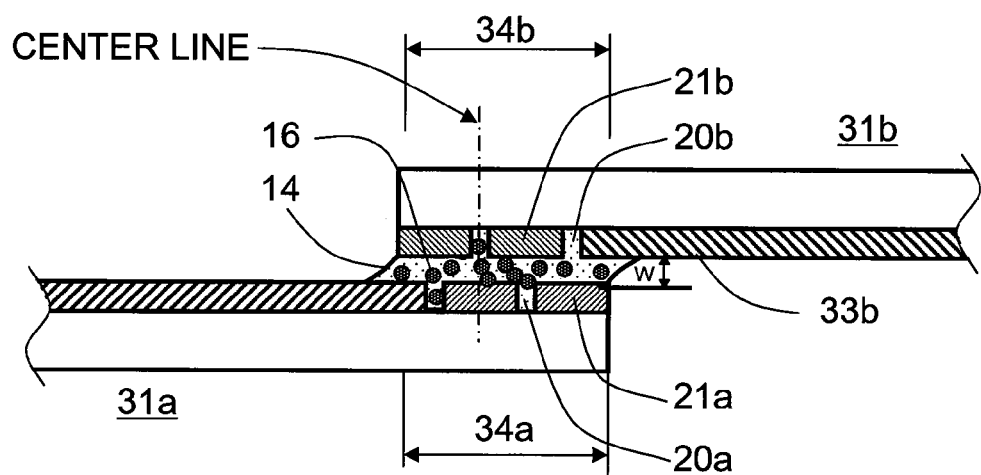
FIG. 3(B) is a cross-sectional view of FIG. 3(A) taken along a straight line A-A.

Next, as shown in FIG. 3(A) and FIG. 3(B), which is a cross-sectional view of FIG. 3(A) taken along a straight line A-A, a second wiring board 31b, which is the connection target, is arranged on the wiring board 31a via the fluid 14. The second wiring board 31b has the same shape as that of the first wiring board 31a, and also has connection terminals 34b having the same dimensions and shape as those of the connection terminals 34a.

More specifically, the wiring board 31b is aligned with the wiring board 31a so that the connection terminals 34b of the wiring board 31b are made to face the connection terminals 34a of the wiring board 31a, and the center lines of the independent electrodes 21a and the center lines of the grooves 20b correspond with each other. At this time, since the wiring boards 31a and 31b have the same shape and dimensions, the center lines of the independent electrodes 21b and the center lines of the grooves 20a also correspond to each other in a similar manner.

The aforementioned alignment results in a configuration in which the grooves 20a, the grooves 20b, the spaces 35a and the spaces 35b are communicatively connected with the fluid 14 interposed therebetween.

In order to align the wiring boards 31a and 31b so that the center lines of the respective independent electrodes and the center lines of the corresponding grooves overlap each other, the width of the independent electrodes need to be larger than the width of the grooves.

Figure 3C:
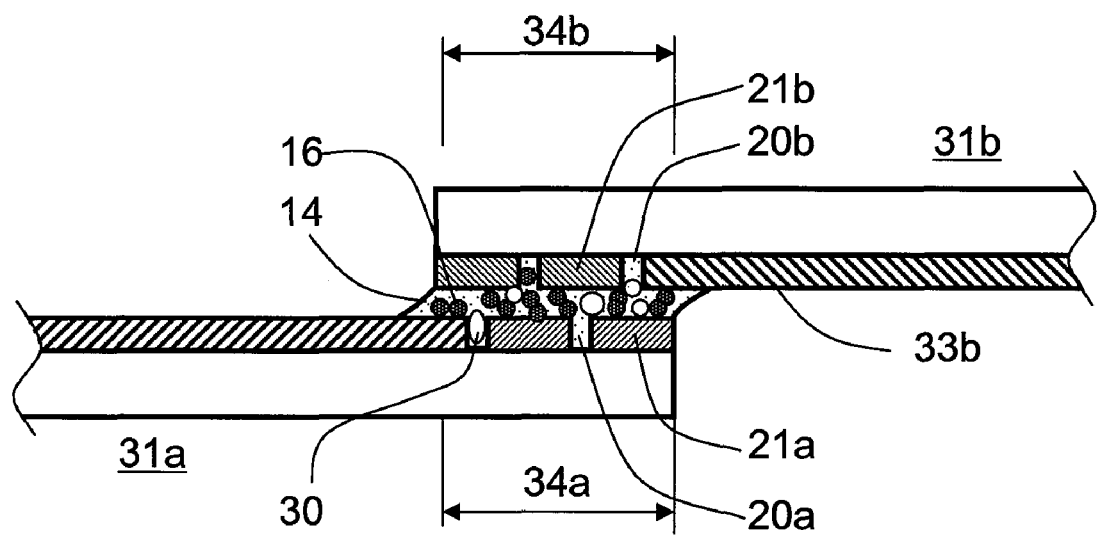
FIG. 3(C) is a cross-sectional view of FIG. 3(A) taken along a straight line A-A for describing a process for a wiring board connection method according to embodiment 1 of the present invention.

Heating the area including the connection terminals 34a and 34b in the state shown in FIG. 3(B), in the fluid 14, as shown in FIG. 3(C), air bubbles 30 are generated from the air bubble generating agent contained in the fluid 14. In embodiment 1, the fluid 14 is heated in a state in which it is in contact with the independent electrodes 21b of the connection terminals 34b formed on the wiring board 31b.

Also, between the independent electrodes 21a of the connection terminals 34a formed on the wiring board 31a and the independent electrodes 21b of the connection terminals 34b formed on the wiring board 31b, a certain gap w is provided, and the dimensions of the certain gap w are larger than the diameter of the conductive particles 16. Also, here, the wiring board 31a and the wiring board 31b are fixed or held so that the certain gap w is maintained, and the fluid 14 is heated in this fixed or held state.

Also, as shown in FIGS. 3(B) and 3(C), the fluid 14 supplied on the connection terminals 34a can remain in the area including the connection terminals 34a and 34b by means of the surface tension between the end portions of the wiring boards 31a and 31b, and accordingly, in this state, the fluid 14 does not spread significantly beyond that area.

Figure 3D:
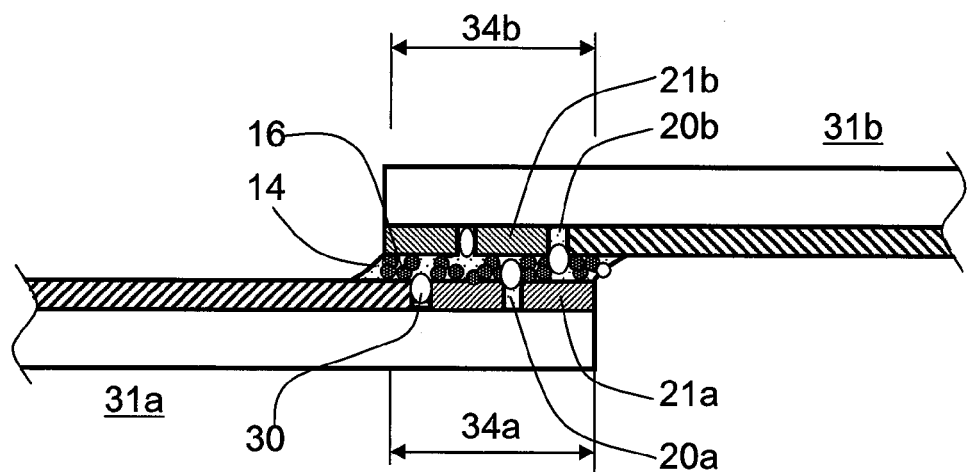
FIG. 3(D) is a cross-sectional view of FIG. 3(A) taken along a straight line A-A for describing a process for a wiring board connection method according to embodiment 1 of the present invention.
Figure 3E:
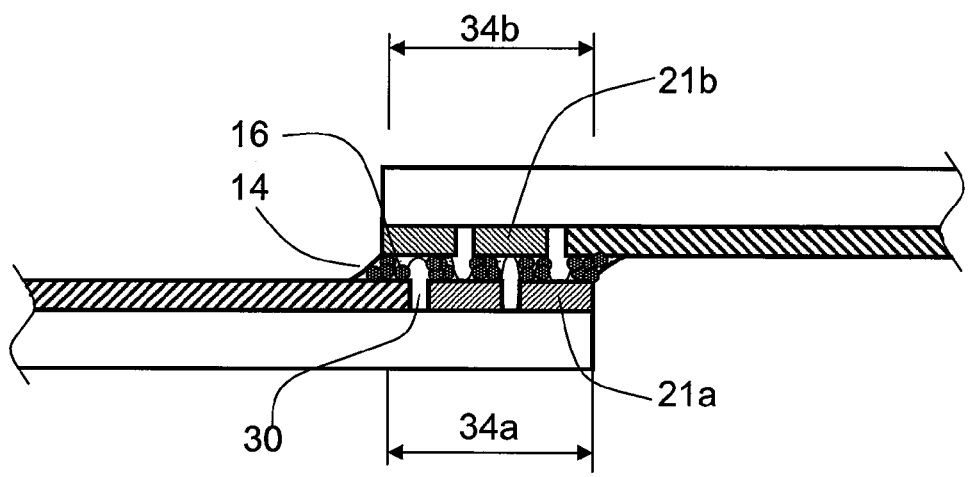
FIG. 3(E) is a cross-sectional view of FIG. 3(A) taken along a straight line A-A for describing a process for a wiring board connection method according to embodiment 1 of the present invention.

Next, the description of the process after the generation of the air bubbles 30 will be continued with reference to FIGS. 3(D) and 3(E).

As shown in FIG. 3(D), the fluid 14 generates air bubbles 30 inside when it is heated. The air bubbles 30 grow according to the heating and also move around within the fluid 14. Consequently, the fluid 14 also moves.

More specifically, when the air bubbles 30 during heating have a high inner pressure due to expansion, they start to grow or move to extend to the lower-pressure air side.

Here, as described above, since the independent electrodes 21a of the connection terminals 34a and the grooves 20b of the connection terminals 34b, and the independent electrode 21b of the connection terminals 34b and the grooves 20a of the connection terminals 34a are arranged so that the center lines of the respective independent electrodes and the center lines of the corresponding grooves correspond to each other, a configuration in which the grooves 20a, the grooves 20b and the spaces 35a and 35b between adjacent wiring lines are communicatively connected is provided. The air bubbles 30 grow, or move laterally and longitudinally, within the grooves and spaces, and are exhausted to the air. In other words, the air bubbles 30 grow around the independent electrodes 21a and the independent electrodes 21b, and partially remain, and partially move and are exhausted to the air.

The fluid 14, which moves depending on the growth or movement of the air bubbles 30, as shown in FIG. 3(E), gathers in the shape of columns on its interface with the independent electrodes 21a of the connection terminals 34a and on its interface with the independent electrodes 21b of the connection terminals 34b. Concurrently, the conductive particles 16 in the fluid 14 assemble on the independent electrodes 21a and the independent electrodes 21b.

Figure 3F:
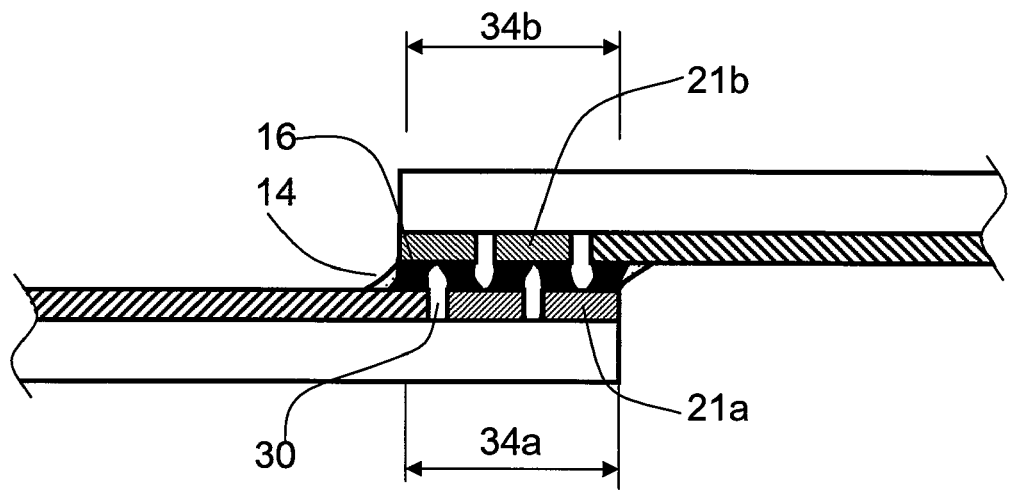
FIG. 3(F) is a cross-sectional view of FIG. 3(A) taken along a straight line A-A for describing a process for a wiring board connection method according to embodiment 1 of the present invention.

Next, further heating the fluid 14, as shown in FIG. 3(F), the conductive particles 16 contained in the fluid 14 are molten, and as a result, the self-assembly of the conductive particles 16 is completed. In other words, the independent electrodes 21a and the independent electrodes 21b are connected via the conductive particles molten therebetween.

Next, the molten conductive particles are solidified by stopping heating and cooling them. As a result, the connection terminals 34a and the connection terminals 34b are completely connected.

Figure 3G:
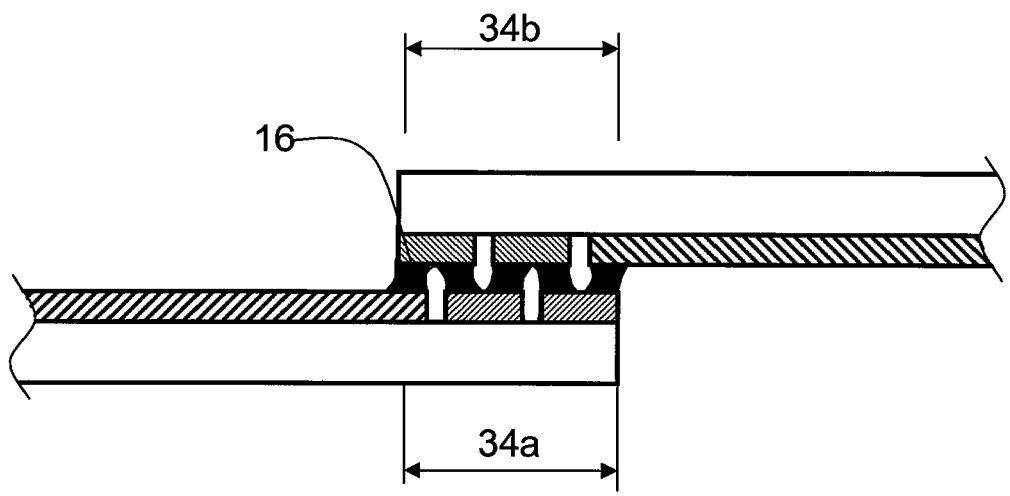
FIG. 3(G) is a cross-sectional view of FIG. 3(A) taken along a straight line A-A for describing a process for a wiring board connection method according to embodiment 1 of the present invention.

Finally, although there are no problems in leaving the fluid 14 other than the solidified conductive particles as it is, after the connection, minute conductive particles may remain in the fluid 14 as residue, it is also preferable that the fluid 14 is removed together with the residue from the perspective of reliability, as shown in FIG. 3(G).

In the aforementioned operation, the grooves 20a and 20b are provided the connection terminals 34a and 35b, respectively, and the independent electrodes 21a and grooves 20a of the connection terminals 34a and the independent electrodes 21b and grooves 20b of the connection terminal 34b are aligned so that the centers of the respective independent electrodes and the centers of the corresponding grooves overlap each other, thereby making it possible for the fluid 14 to accurately self-gather on the independent electrodes 21a and 21b.

This principle will be described below, referring to the reason why an abnormal shape formation occurs in solder powders as conductive particles in a conventional wiring board, which has been found out by the present inventors.

Figure 18A:
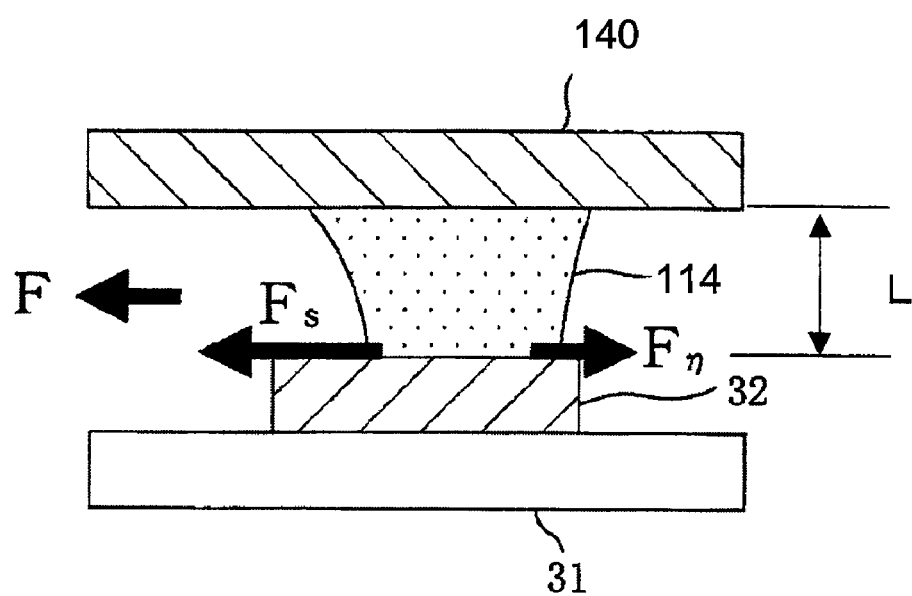
FIG. 18(A) is a diagram for describing a mechanism for self-gathering of a resin.
Figure 18B:
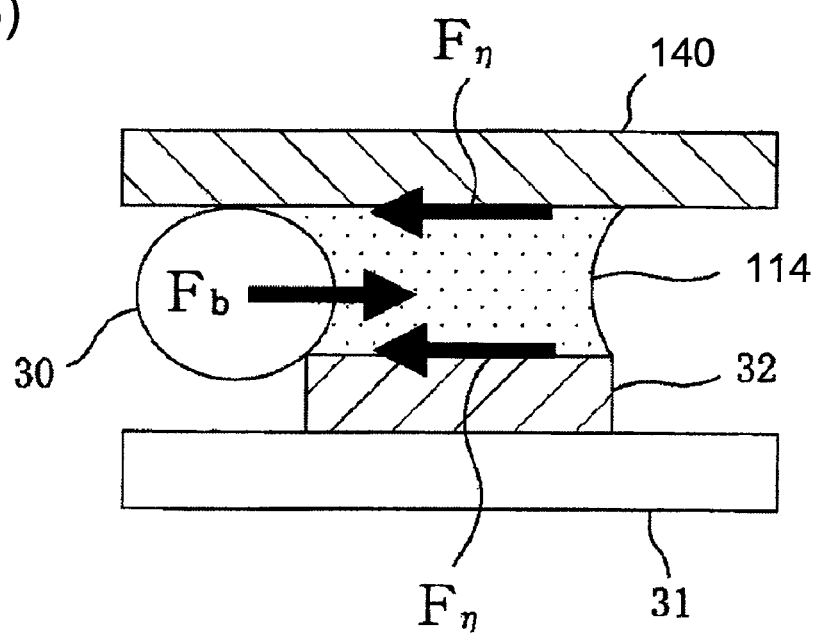
FIG. 18(B) is a diagram for describing a mechanism for self-gathering of a resin.
Figure 19:
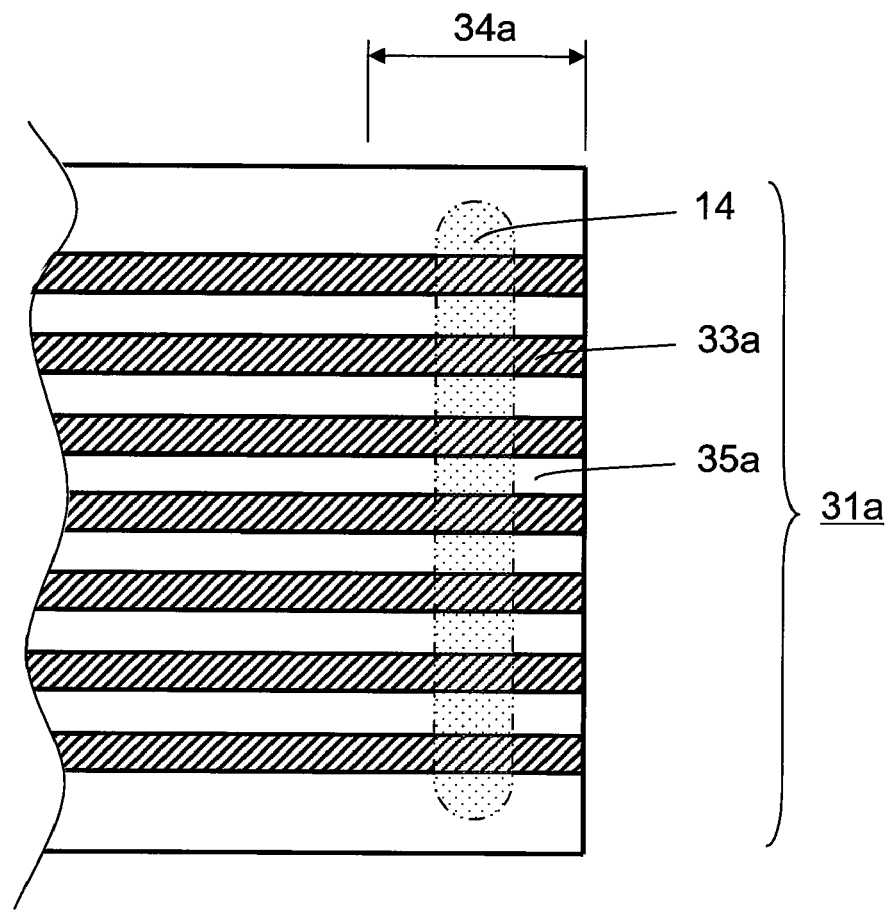
FIG. 19 is a diagram for describing a method which connects wiring boards utilizing self-gathering of a resin.
Figure 21A:
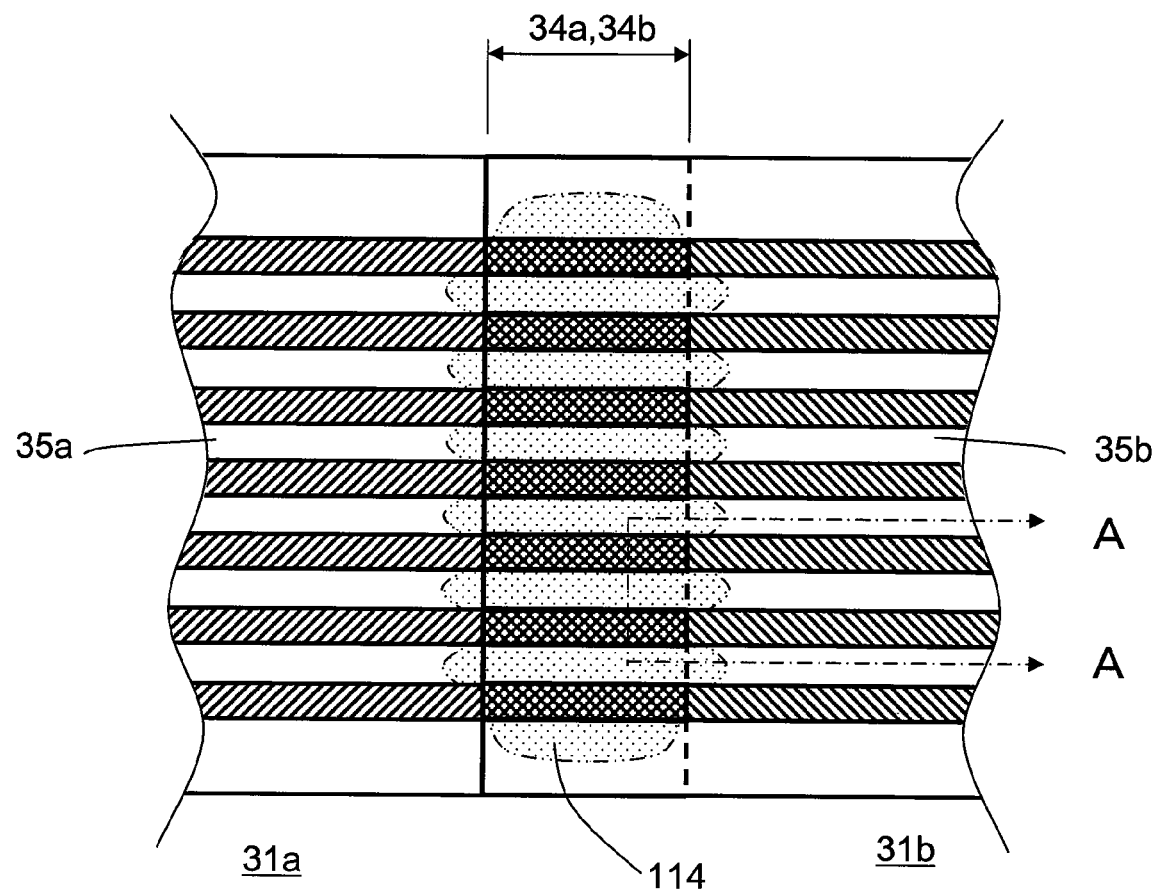
FIG. 21(A) is a diagram showing a state in which a resin and solder powders have been forced out of a connection area.
Figure 21B:
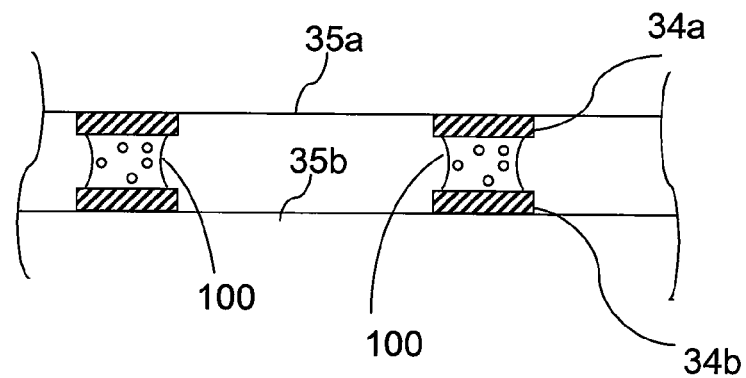
FIG. 21(B) is a diagram for describing a principle of a resin and solder powders being forced out of a connection area.
Figure 22:
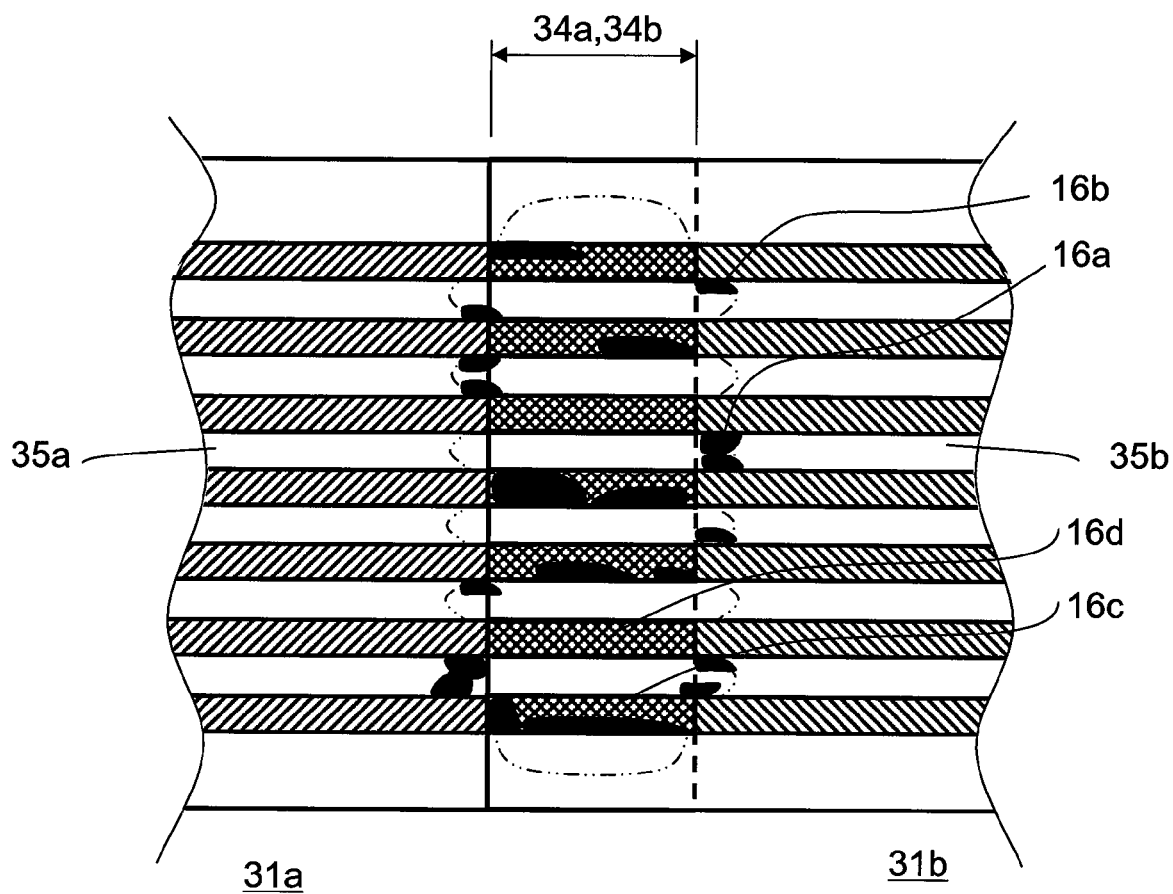
FIG. 22 is a diagram for describing a state in which solder powders have been molten and solidified after assembling.

The phenomenon shown in FIG. 21(A) and FIG. 22 in which the moved solder powders are molted and short-circuited with their neighboring wiring lines can be considered to occur for the following reasons. In other words, when heating a resin as an applied fluid, air bubbles are generated from an air bubble generating agent contained in the resin, and make the resin move. By means of the mechanism described with reference to FIGS. 16 to 18, the resin gathers on the connection terminals 34a and 34b, but when a certain amount of resin gathers, as shown in FIG. 21(B), which is a partial cross-sectional view of FIG. 21(A) taken along a straight line A-A, the resin forms columns between the respective opposing terminals. These columns constitute wall surfaces along the wiring lines 33a and 33b, which makes it difficult for the air bubbles to grow or move beyond these wall surfaces.

Figure 4A:
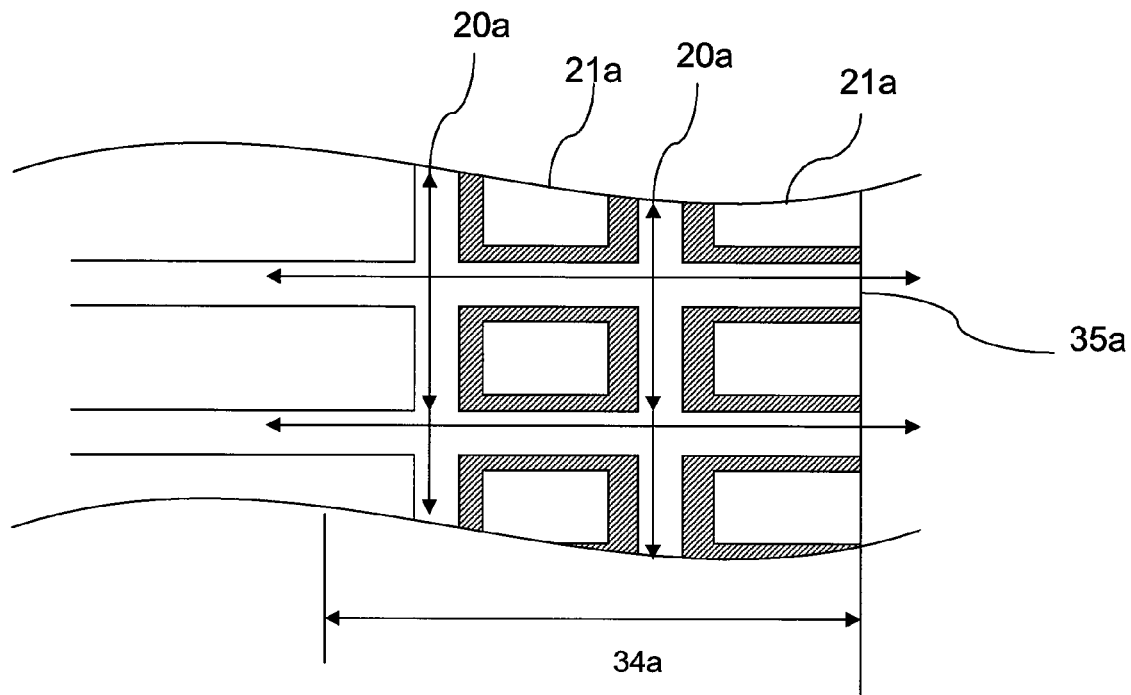
FIG. 4(A) is a schematic diagram for describing a principle of a wiring board connection method according to embodiment 1 of the present invention.
Figure 4B:
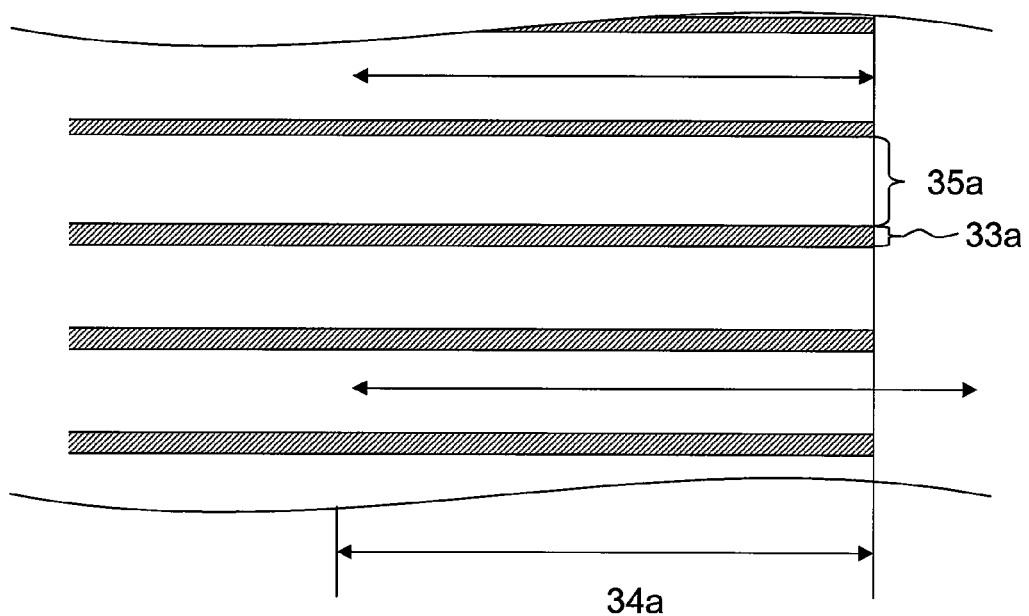
FIG. 4(B) is a schematic diagram for describing an analysis in comparison with a principle of the wiring board connection method according to embodiment 1 of the present invention.

Accordingly, the direction of the growth or movement of the air bubbles after the wall surfaces of the resin being formed on the wiring lines 33a and 33b, as shown in FIG. 4(B), is limited to the longitudinal direction of the spaces 35a surrounded by the connection terminals 33a. Also, since the area where the air bubbles are generated is a thin and rectangular space, the pressure of the air bubbles increases.

Due to these reasons, it can be considered that the resin that should essentially gather on the electrodes 35a are forced out of the connection area along with the growth or movement of the air bubbles, thereby leakage of the resin occurring as shown in FIG. 21(A).

The solder powders contained in the leaked resin gather on the connection wiring lines outside the connection area and are molten and solidified.

Meanwhile, it can be considered that as a result of the solder powders that should essentially gather on the connection terminals being forced out, the amount of solder that should be formed on the connection terminals 33a becomes insufficient, thereby unconnected regions occurring between the connected substrates. This can be considered as partly resulting from the direction of the areas on the wiring lines 33a corresponding to the interfaces between the air bubbles, which make the resin gather, and the connection terminals 34a being limited to the longitudinal direction of the wiring lines 33a indicated by arrows in the Figure.

In the present embodiment, as a result of employing the aforementioned configuration to solve the aforementioned problems, the area where the air bubbles can grow or move, as shown in FIG. 4(A), is an area including the grooves 20a, which are perpendicular to the spaces 35a, in addition to the spaces 35a.

Since the outermost parts of the spaces 35a and grooves 20a are communicatively connected to the outside, the air bubbles can grow or move in the direction indicated by arrows in the Figure along the spaces 35a and the grooves 20a based on the difference between the pressure in the outside and the inner pressure of the air bubbles. Also, as a result of increasing the number of parts that are communicatively connected to the outside, the pressure difference becomes small, preventing the air bubbles from growing or moving at an excessive high pace. Furthermore, the areas on the independent electrodes 21 corresponding to the interfaces between the air bubbles, which make the resin gather, and the connection terminals 34a expand in the lateral and longitudinal directions as indicated by the shaded areas in FIG. 4(A).

For these reasons, the amount of fluid 14 leaking to the outside is reduced, and a large part of fluid 14 self-gathers on the independent electrodes 21a along with the growth or movement of the air bubbles. Accordingly, the problems of adjacent wiring line and connection terminal short-circuiting and unconnected connection terminals, etc., can be solved, and it becomes possible to electrically connect wiring boards with an excellent uniformity and a high productivity.

Here, although the fluid 14, the conductive particles 16 and the air bubble generating agent used in embodiment 1 correspond to a conductive joint body, conductive particles and an air bubble generating agent according to the present invention, respectively, the present invention is not limited by their specific compositions. However, the following materials can be used for the respective components.

For the fluid 14, any material having a viscosity of a degree that the material can flow in the range of from room temperature to the melting temperature of the conductive particles 16 may be used, including a material whose viscosity is reduced by heating to a degree that the material can flow. For representative examples, there may be mentioned: thermosetting resins such as epoxy resins, phenol resins, silicone resins, diallyl phthalate resins, furan resins, and melamine resins; thermoplastic resins such as polyester elastomers, fluorine resins, polyimide resins, polyamide resins, aramid resins; photo (ultraviolet ray)-setting resins; and combinations of these materials. Other than resins, high boiling point solvents and oils, etc. can be used.

For the conductive particles 16 and the air bubble generating agent, proper combinations of materials such as those shown in FIG. 5 and FIG. 6 can be used. Using a material having a melting point higher than the boiling point of the air bubble generating agent for the conductive particles 16, it is possible to metallically bond the conductive particles with one another by heating the fluid 14 to generate air bubbles from the air bubble generating agent and make the fluid self-gather, and then further heating the fluid 14 to melt the conductive particles in the self-gathered fluid.

Also, the air bubble generating agent may be a material consisting of two or more materials having different boiling points. The boiling point difference causes a difference in the timing of air bubble generation and growth, and as a result, the movement of the fluid 14 due to the air bubble growth is carried out stepwise, and accordingly, the self-gathering process of the fluid 14 becomes uniform, making stable wiring board connection possible.

For the air bubble generating agent, other than those listed in FIG. 6, a material that generate air bubbles as a result of thermal decomposition of the air bubble generating agent upon the fluid 14 being heated can also be used. For such air bubble generating agent, the materials listed in FIG. 7 can be used. For example, when a compound containing crystal water (aluminum hydroxide) is used, it is thermally decomposed upon the fluid 14 being heated, and water vapor is generated in the shape of air bubbles.

In the Figures illustrating the aforementioned process, the amount of fluid 14 supplied is indicated with exaggeration, and in reality, an amount favorable for self-gathering between the connection terminals 34a and 34b and determined by considering errors is supplied.

Also, supposing that all of the conductive particles 16 contained in the volume (VB) of the fluid (for example, a resin) 14 supplied on the connection terminals 34a contribute to the connection between the independent electrodes 21a and the independent electrodes 21b, the following relational expression (1) can be established between the total volume (VA) of the connection part and the volume (VB) of the fluid 14.

[Formula 2]

$$VA:VB \approx SA:SB \quad (1)$$

Here, SA represents the total area of the independent electrodes 21a, and SB represents the area of the connection terminals 34a. Accordingly, the content of the conductive particles 16 in the fluid 14 is expressed by the following formula (2).

[Formula 3]

$$\text{(Content of the conductive particles 16)} = SA/SB \times 100 \text{ [\% by volume]} \quad (2)$$

Accordingly, an optimum amount of conductive particles 16 in the fluid 14 can generally be determined based on the following formula (3).

[Formula 4]

$$\text{(Content of the conductive particles 16)} = (SA/SB \times 100) \pm \alpha [\% \text{ by volume}] \quad (3)$$

The above parameter ($\pm\alpha$) is intended to adjust overage and shortage of the conductive particles 16 self-assembling between the independent electrodes 21a and 21b, and can be determined according to various conditions.

According to formula (3), the amount of conductive particles 16 dispersed in the fluid 14 is sufficient if the conductive particles 16 are contained in the fluid at a percentage of from 0.5% to 30% by volume. In general, the weight ratio between the conductive particles 16 and the fluid 14 is approximately 7:1, and accordingly, the aforementioned percentage of from 0.5% to 30% by volume roughly corresponds to the percentage of from 4% to 75% by weight.

Although in embodiment 1 described above, the fluid 14 is supplied on the connection terminals 34a, and then the connection terminals 34b are arranged, the present invention is not limited to that, and it is possible that the center lines of the independent electrodes 21a of the connection terminals 34a and the center lines of the grooves 20b of the connection terminals 34b are first made to correspond with each other and arranged so that they face each other in such a manner that a gap w is generated, and the fluid 14 containing the conductive particles 16 and the air bubble generating agent is then supplied to this gap w. In brief, the present invention is not limited by the sequence of the process for aligning the substrates to be connected and the process for supplying the fluid 14.

(Embodiment 2)

Next, a wiring board according to embodiment 2 of the present invention will be described.

Figure 8A:
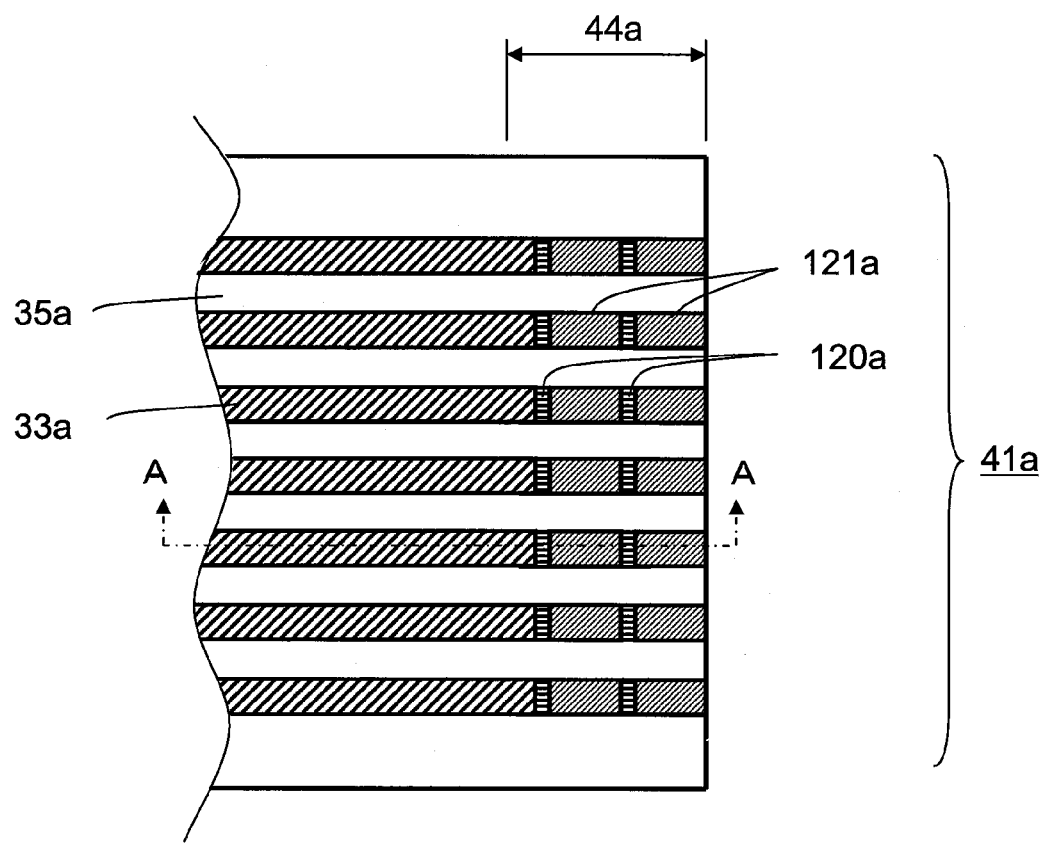
FIG. 8(A) is a plan view for describing a wiring board connection method according to embodiment 2 of the present invention.
Figure 8B:
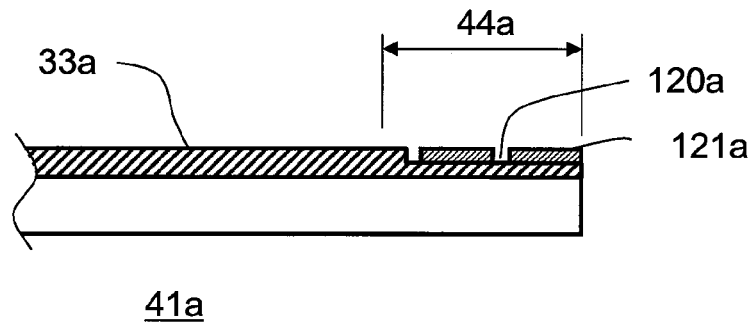
FIG. 8(B) is a cross-sectional view of FIG. 8(A) taken along a straight line A-A.

FIG. 8(A) is a plan view of a wiring board, and FIG. 8(B) is a cross-sectional view of FIG. 8(A) taken along a straight line A-A.

As shown in these Figures, a wiring board 41*a* according to the present embodiment is characterized in that each connection terminal 44*a* have grooves 120*a* as recesses with a partly-remained wiring layer on a wiring line 33*a*.

Furthermore, a plurality of wiring lines 33*a* are provided and the area indicated by an arrow in the Figures is a connection terminal 44*a* formed by an end portion of the wiring line 33*a*, and the line length of the connection terminal 44*a* is 0.9 mm. The width of each wiring line 33*a* is 0.05 mm, which is the same as in embodiment 1, and the width of a space 35*a* between adjacent wiring lines 33*a* is 0.05 mm. Accordingly, the wiring lines 33*a* are formed according to the wiring rule for a pitch of 0.1 mm.

In the connection terminal 44*a* of each wiring line 33*a*, an electrode pattern 121*a*, which is divided by the grooves 120*a* only at its surfaces, is formed.

The line length of the surfaces of the individual electrodes constituting the electrode pattern 121*a* is 0.3 mm, and as a result of the division by the grooves 20*a* with a width of 0.1 mm, two electrodes are formed in the area of the connection terminal 44*a* with a line length of 0.9 mm.

Figure 8C:
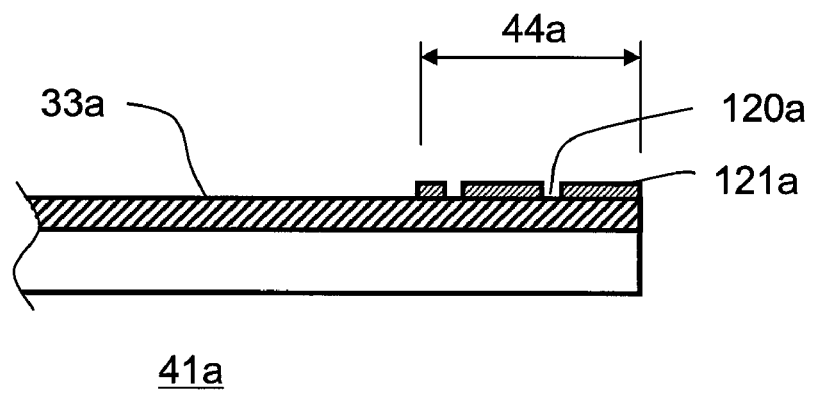
FIG. 8(C) is a diagram illustrating another example of a wiring board used in a wiring board connection method according to embodiment 2 of the present invention in a cross section corresponding to a cross-sectional view of FIG. 8(A) taken along a straight line A-A.

FIG. 8(C) shows an example in which the surfaces of the electrode patterns 121*a* are made to be higher than the surfaces of the wiring lines 33*a*, which can be obtained by selectively plating an area including the connection terminals 44*a* to form the electrode patterns 121*a* on the wiring lines 33*a*. Here, the parts in which no plating has been performed become the grooves 120*a* as the recesses. In this configuration, the grooves 120*a* has a depth not reaching a surface of the wiring board, while grooves 20*a* of the embodiment 1 has a depth reaching a surface of the wiring board.

Also, as a method which forms the electrode patterns 121*a* on the wiring lines 33*a*, sputtering, vapor deposition, etc., may be used other than plating.

However, the example shown in FIGS. 8(A) to 8(C) is merely an example, and the present invention is not limited to these dimensions and shape. The dimensions and shape, and the quantity of the electrode patterns 121*a* (i.e. the line length, width, shape and the number of the electrodes constituting each electrode pattern 121*a*), and the dimensions, shape and depth of the grooves 120*a* can specifically be determined in each case according to the wiring rule and the connection conditions.

Figure 8D:
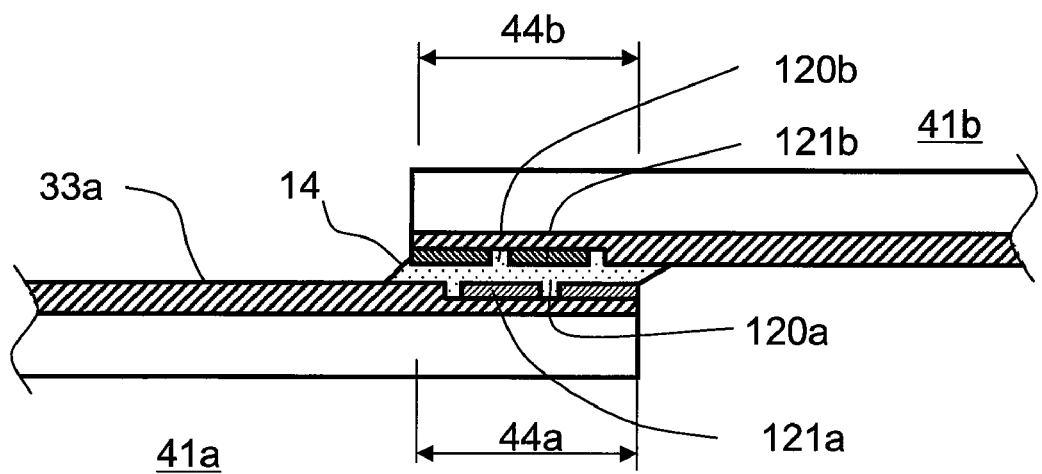
FIG. 8(D) is a diagram using a cross-sectional view of FIG. 8(A) taken along a straight line A-A for describing a wiring board connection method according to embodiment 2 of the present invention.

FIG. 8(D) is a diagram for describing a state in which a set of the aforementioned wiring boards is employed to connect them, which indicates an example in which the wiring board 41*b* having the same shape of the wiring board 41*a* and also having the connection terminals 44*b* having the same dimensions and shape as those of the connection terminals 44*a* is provided and this wiring board 41*b* and the wiring board 41*a* are connected.

On the connection terminals 44*a*, a fluid 14 containing conductive particles and an air bubble generating agent is supplied, the other connection terminals 44*b* including independent electrode patterns 121*b* and grooves 120*b* are arranged so that they face the connection terminals 44*a*. The wiring boards are aligned so that the center lines of the individual electrodes in the electrode patterns 121*a* in the connection terminal 44*a* and the center lines of the corresponding grooves 120*b* correspond to each other, thereby obtaining a configuration in which the grooves 120*a*, the grooves 120*b*, the spaces 35*a* and spaces 35*b* are communicatively connected to each other with the fluid 14 interposed therebetween.

Next, the description of a method which connects the wiring boards 41*a* and 41*b* by means of the process of performing heating concentrated on the fluid 14 to generate air bubbles from the air bubble generating agent contained in the fluid 14, and the process of the air bubble generated from the air bubble generating agent making conductive particles self-assemble on the connection terminals 44*a* and 44*b* is omitted because it is the same as that of embodiment 1 of the present invention.

Also, in the wiring board connection method according to embodiment 2, the air bubbles growing as a result of heating the fluid 14 grow or move laterally and longitudinally in the grooves and the spaces and are exhausted to the air. As a result, the air bubbles move only in spaces 35*a* and do not force the resin and the conductive particles out of the connection area, and accordingly, a majority of the fluid 14 self-gathers on the connection terminals 44*a* and 44*b*, and the problems such as adjacent wiring line and connection terminal short-circuiting and unconnected connection terminals can be solved.

Also, in the aforementioned configuration, the wiring board 41*a* or 41*b* corresponds to a wiring board according to the present invention, each connection terminal 44*a* or 44*b* corresponds to a connection terminal according to the present invention, and each groove 120*a* or 120*b* corresponds to a groove according to the present invention.

(Embodiment 3)

Next, a wiring board according to embodiment 3 of the present invention will be described.

Figure 9:
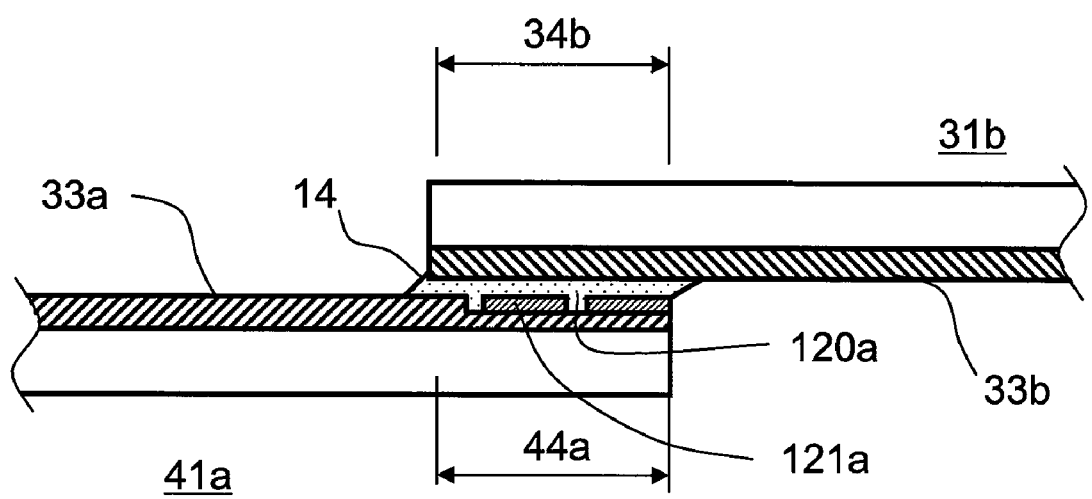
FIG. 9 is a cross-sectional view for describing a wiring board connection method according to embodiment 3 of the present invention.

Embodiment 3 is shown in FIG. 9. A wiring board 41*a* has a configuration similar to that of embodiment 2 shown in FIG. 8(A), etc., and the detailed description thereof will be omitted.

Figure 20A:
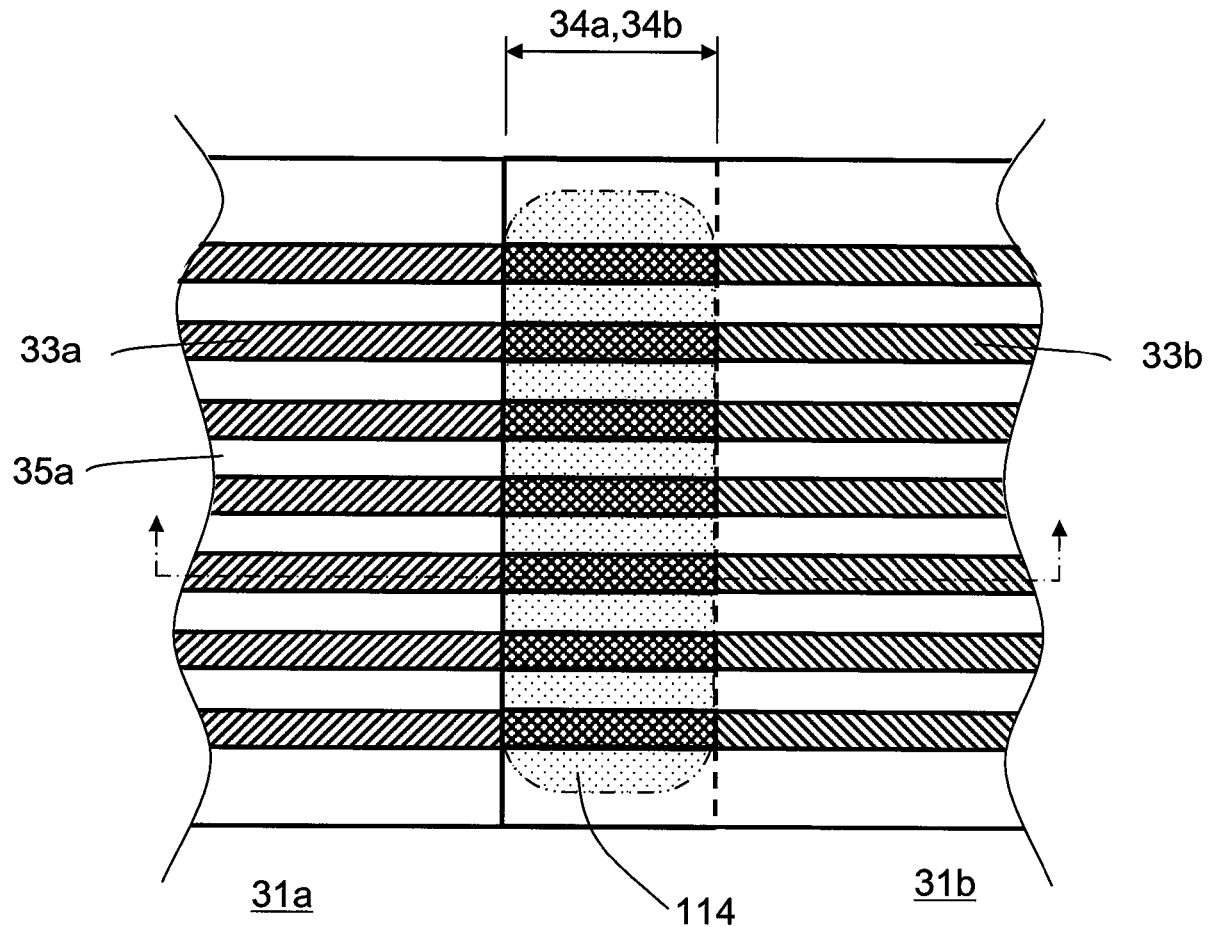
FIG. 20(A) is a plan view for describing a method which connects wiring boards utilizing self-gathering of a resin.
Figure 20B:
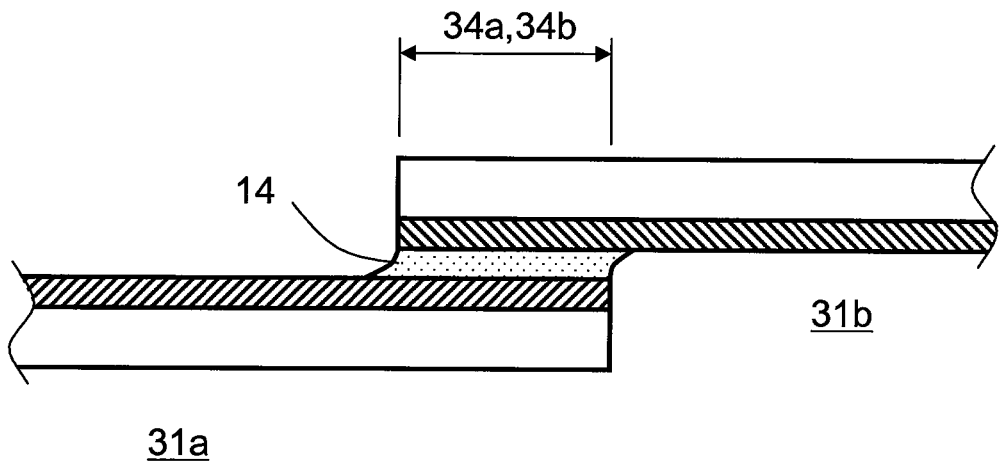
FIG. 20(B) is a cross-sectional view of FIG. 20(A) taken along a straight line A-A.

The other wiring board 31*b* has a configuration similar to that of the example shown in FIG. 20, and no grooves are provided in the area of connection terminals 34*b*.

Even when these wiring board 41*a* and 31*b* are aligned by making them face each other, since grooves 120*a* are provided in the connection terminals 44*a* of the wiring board 41*a*, the grooves 120*a* and spaces between wiring lines 33*a* are communicatively connected to each other. Consequently, as in embodiments 1 and 2, air bubbles generated by heating a fluid 14 grow or move laterally and longitudinally in the grooves 120*a* and spaces between the wiring lines 33*a* and are exhausted to the air. The air bubbles move only in spaces 35*a* and do not force the resin and the conductive particles out of the connection area, and accordingly, it is possible to make a majority of the fluid 14 self-gather on the areas between the electrodes in electrode patterns 121*a* on the wiring board 41*a* and wiring lines 33*b* in the connection terminals 34*b* on the wiring board 31*b*. Subsequently, by making the conductive particles contained in the self-gathered fluid 14 melt, the connection consisting of the molten conductive particles can be formed in a self-adjusting manner in that area, making it possible to achieve highly-productive electric connection of wiring boards.

Although in the description above, the wiring board 31*a* with no grooves has been described as one made to face the wiring board 41*a* according to embodiment 2, it may be made to face the wiring board 31*a* according to embodiment 1. In that case, since the grooves have a larger depth, the growth or movement of the air bubbles in the groove direction is facilitated, providing the effect of the fluid 14 being collected on the electrodes more efficiently.

(Embodiment 4)

Next, a wiring board connection method and a wiring board according to embodiment 4 of the present invention will be described.

In embodiment 4, a method in which a film of a thermosetting resin containing conductive particles is put on connection terminals of one wiring board, and is pressurized and heated with connection terminals of the other wiring board superposed thereon, thereby conductive particles being interposed between the opposing connection terminals and obtaining electric connection will be described.

Figure 10A:
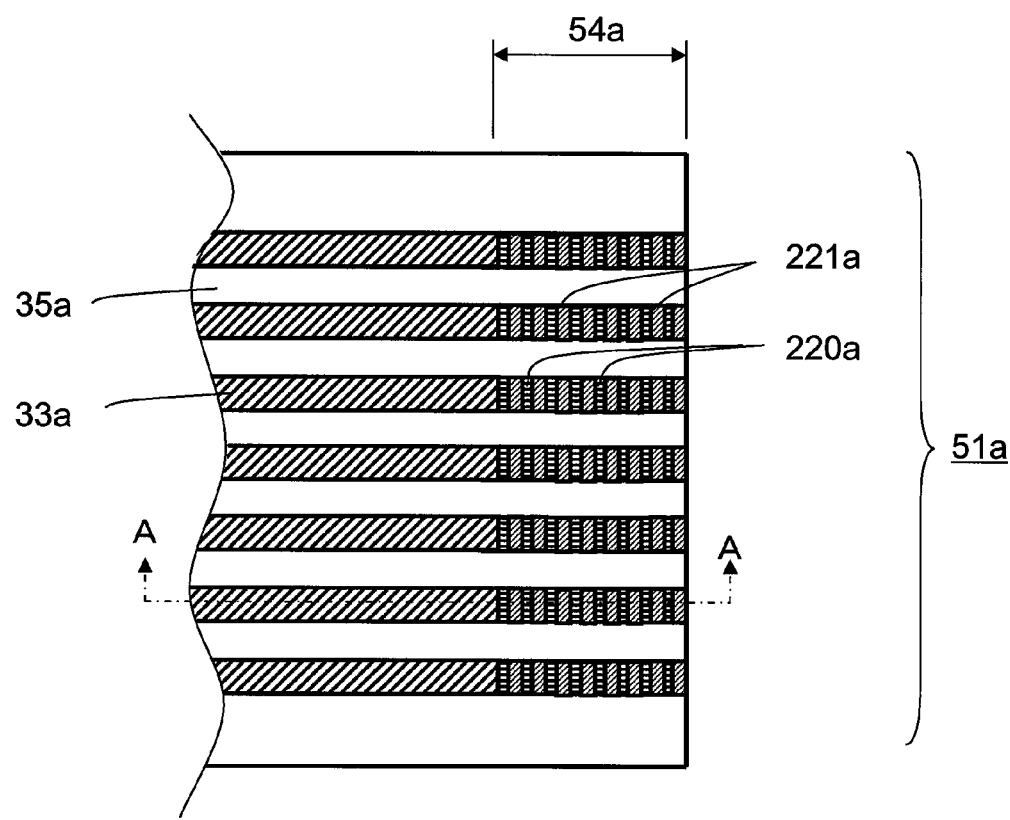
FIG. 10(A) is a plan view for describing a wiring board connection method according to embodiment 4 of the present invention.
Figure 10B:
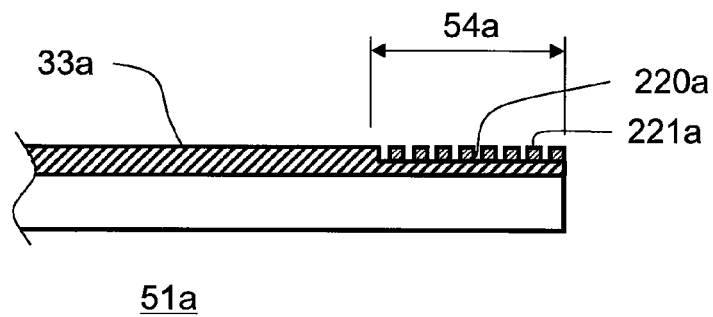
FIG. 10(B) is a cross-sectional view of FIG. 10(A) taken along a straight line A-A.

FIG. 10(A) is a plan view of a wiring board, and FIG. 10(B) is a cross-sectional view of FIG. 10(A) taken along a straight line A-A.

As shown in these Figures, a wiring board 51a is characterized in that each connection terminal 54a has grooves 220a formed as recesses on a wiring line 33a with its wiring layer partly remained.

Furthermore, a plurality of wiring lines 33a are provided, and the area indicated by an arrow in the Figures is a connection terminal 54a of the wiring line 33a, and the line length thereof is 0.9 mm. The width of each wiring line 33a is 0.05 mm as in the other embodiments, and a space 35a between adjacent wiring lines is 0.05 mm. Accordingly, the wiring lines 33 are formed according to the wiring rule for a pitch of 0.1 mm.

In the connection terminal 54a of each wiring line 33a, an electrode pattern 221a, which is divided by the grooves 220a only at its surface, is formed.

The line length of the surfaces of the individual electrodes constituting the electrode pattern 221a is 0.1 mm, and as a result of the division by the grooves 220a with a width of 0.05 mm, eight electrodes are formed in the area of the connection terminal 54a with a line length of 0.9 mm.

However, the example shown in FIG. 10(A) and 10(B) is a mere example, and the present invention is not limited to these dimension and shape. The dimensions and shape, and the quantity of the electrode patterns 221a (i.e. the line length, width, shape and the number of the electrodes constituting each electrode pattern 221a), and the dimensions, shape and depth of the grooves 120a can specifically be determined in each case according to the wiring rule and the connection conditions.

Figure 10C:
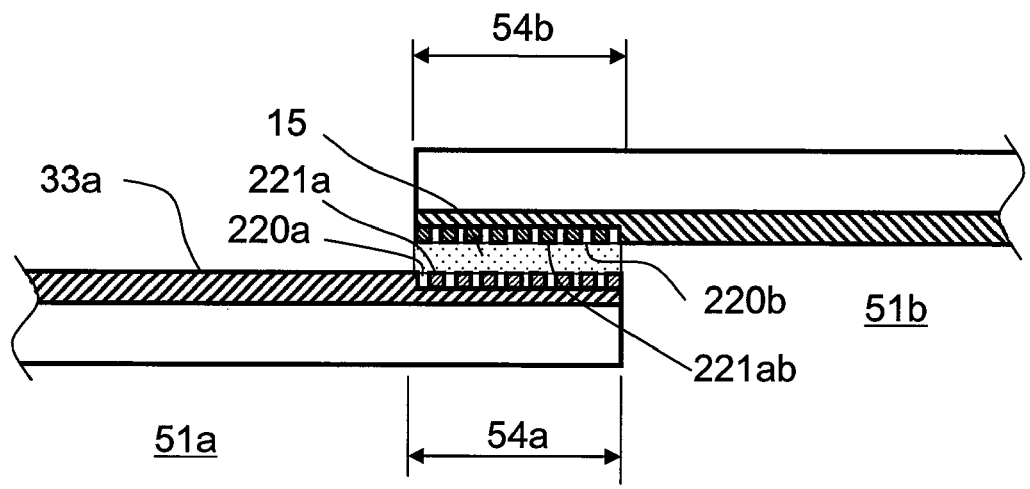
FIG. 10(C) is a diagram using a cross-sectional view of FIG. 10(A) taken along a straight line A-A for describing a process for a wiring board connection method according to embodiment 4 of the present invention.

FIG. 10(C) is a diagram for describing a state in which a set of the aforementioned wiring boards is used to connect them, which indicates an example in which a wiring board 51b having the same shape as that of a wiring board 51a, and also have connection terminals 54b having the same shape and dimensions as those of connection terminals 54a is provided and this wiring board 51b and the wiring board 51a are connected.

In FIG. 10(C), a film 15 is a film of a thermosetting resin containing conductive particles, which is formed of an anisotropic conductive material, and is tentatively fixed on the connection terminals 54a of the wiring board 51a. When the wiring boards are put together with the film 15 tentatively fixed therebetween, air bubbles often intrude into the interfaces for connection with the film 15.

At this time, the wiring boards are aligned so that the center lines of the individual electrodes in the electrode patterns 221a in the connection terminals 54a and the center lines of the corresponding grooves 220b correspond to each other.

Figure 10D:
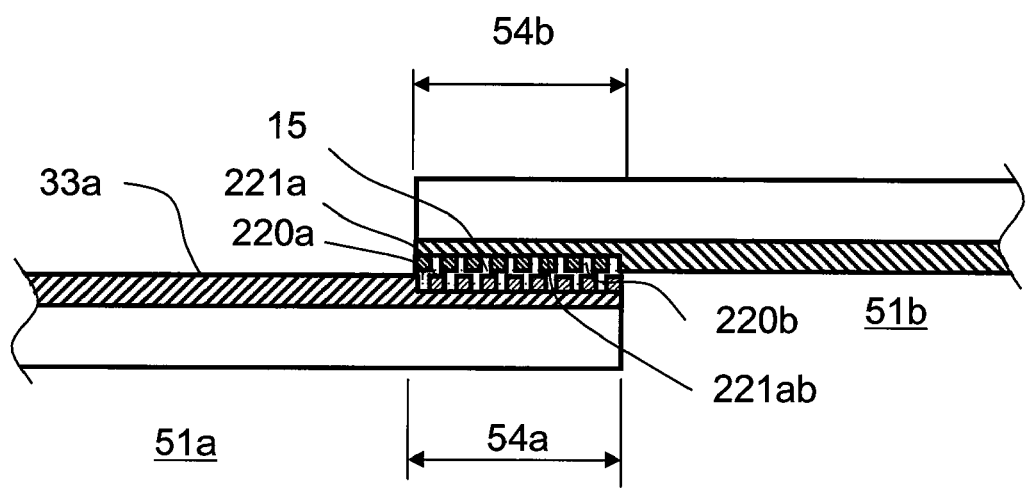
FIG. 10(D) is a diagram using a cross-sectional view of FIG. 10(A) taken along a straight line A-A for describing a process for a wiring board connection method according to embodiment 4 of the present invention.

FIG. 10(D) shows a state in which the connection terminals 54a and 54b are pressurized while performing heating concentrated on the film 15. In the film 15, the thermosetting resin is softened by the heating, and also becomes thin because of the pressurization. At this time, conductive particles 40 contained in the film 15 are sandwiched between the connection terminals 54a and the connection terminals 54b, and strongly contact with each other.

When the film 15 becomes soft, the air bubbles intruding during this pressurizing process are exhausted to the outside along with their movement to the grooves 220a and 220b and the spaces between the wiring lines 33a. Furthermore, air bubbles existing inside the film 15 or generated as a result of the heating are also exhausted in a similar manner. Accordingly, even when a film 15 is used as a conductive joint body, it is possible to solve the problem in that air bubbles remain between the connection terminals, as in embodiments 1 to 3.

Furthermore, it is possible to connect the wiring boards by curing the thermosetting resin with a heated and pressurized state maintained and then cooling the heated part.

Although the above description has referred to an example using a film of a thermosetting resin containing conductive particles, a similar effect can be obtained using a paste of a thermosetting resin containing conductive particles for a conductive joint body according to the present invention.

Accordingly, the conventional reliability problems, e.g., in that the electric connection becomes unstable or easily opens as a result of air bubbles intruding into the interfaces between the film and the terminal electrodes expanding by moisture absorption and heating, and breaking the point contact parts between the conductive particles and the terminal electrodes can also be solved.

In the aforementioned configuration, the wiring board 51a or 51b corresponds to a wiring board according to the present invention, each connection terminal 54a or 55b corresponds to a connection terminal according to the present invention, and each groove 220a or 220b corresponds to a groove according to the present invention.

In embodiments 2 to 4 above, the grooves 120a and 220a, etc., are prepared by forming the electrode patterns 121a and 221a, etc., on the wiring lines by sputtering or vapor deposition, etc., other than plating, and in this case, the recesses as the grooves according to the present invention correspond to the inverted shapes of the relevant electrode patterns. However, the recesses as the grooves according to the present invention may be formed by directly forming recesses on the wiring lines by means of etching, etc. In brief, the recesses are not limited by their formation method.

The preferred embodiments of the present invention have been described above, and in each of the embodiments, heating is concentrated on the connection terminal area, providing an advantage in that thermal damage due to heating does not occur in previously-mounted components, such as active components and passive components.

Also, the present invention described above can use a flexible print circuit board (FPC), a hard substrate, a rigid-flex circuit board, etc., as a wiring board, and is preferable for connecting these substrates.

Figure 11:
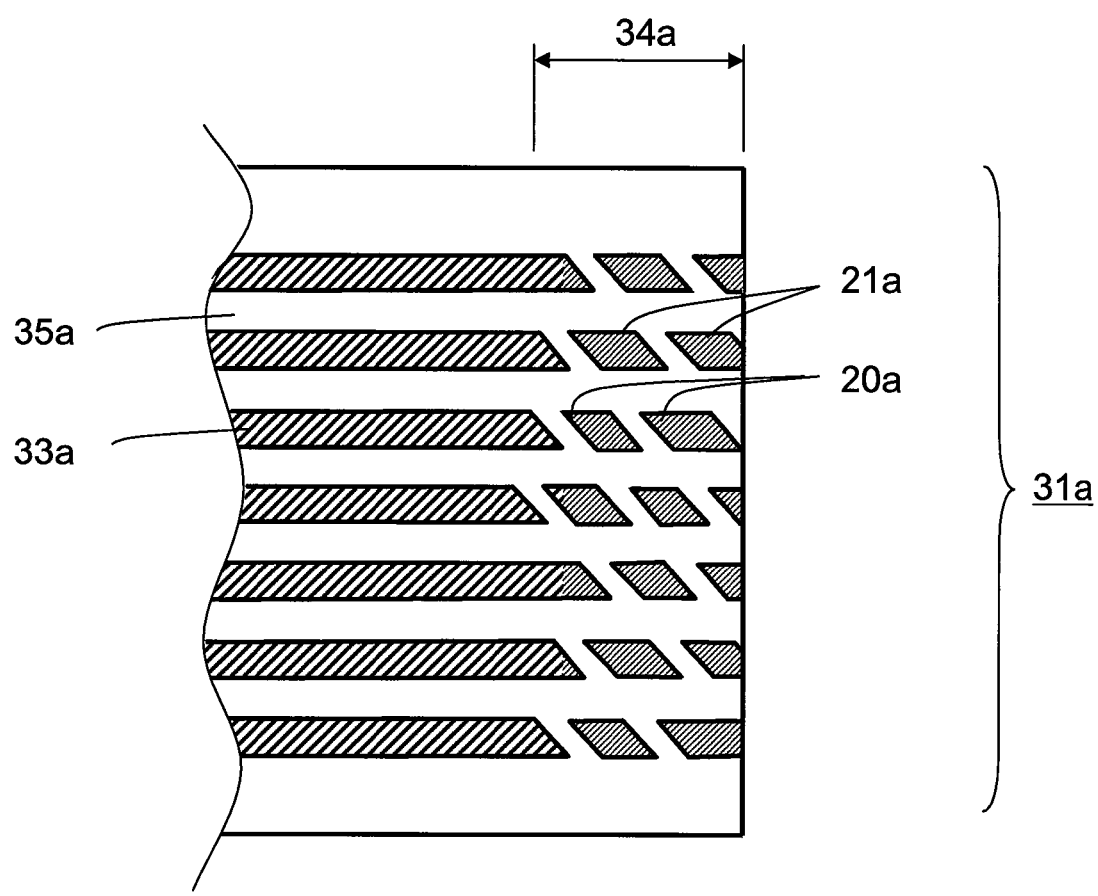
FIG. 11 is the other configuration diagram of a wiring board used in a wiring board connection method according to the present invention.
Figure 12:
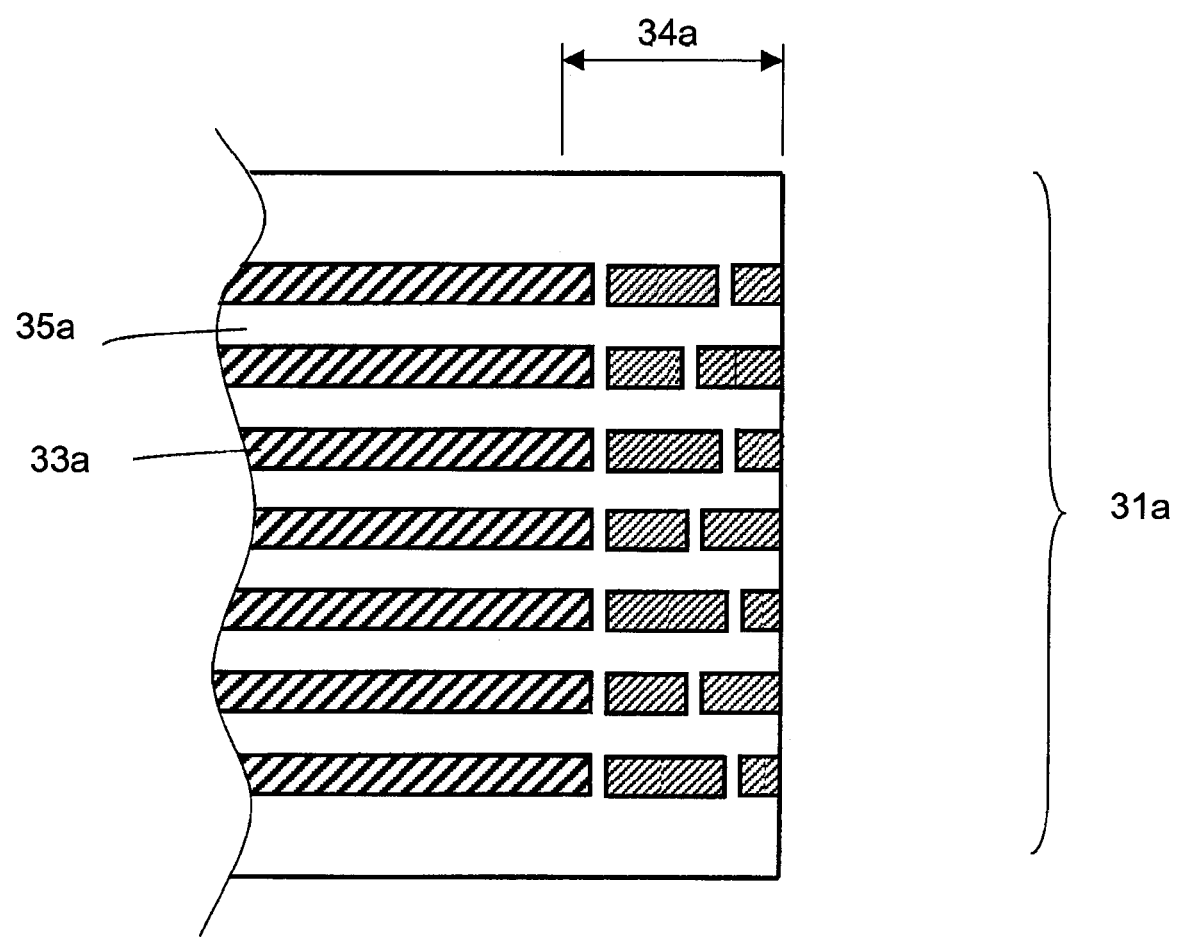
FIG. 12 is the other configuration diagram of a wiring board used in a wiring board connection method according to the present invention.
Figure 13:
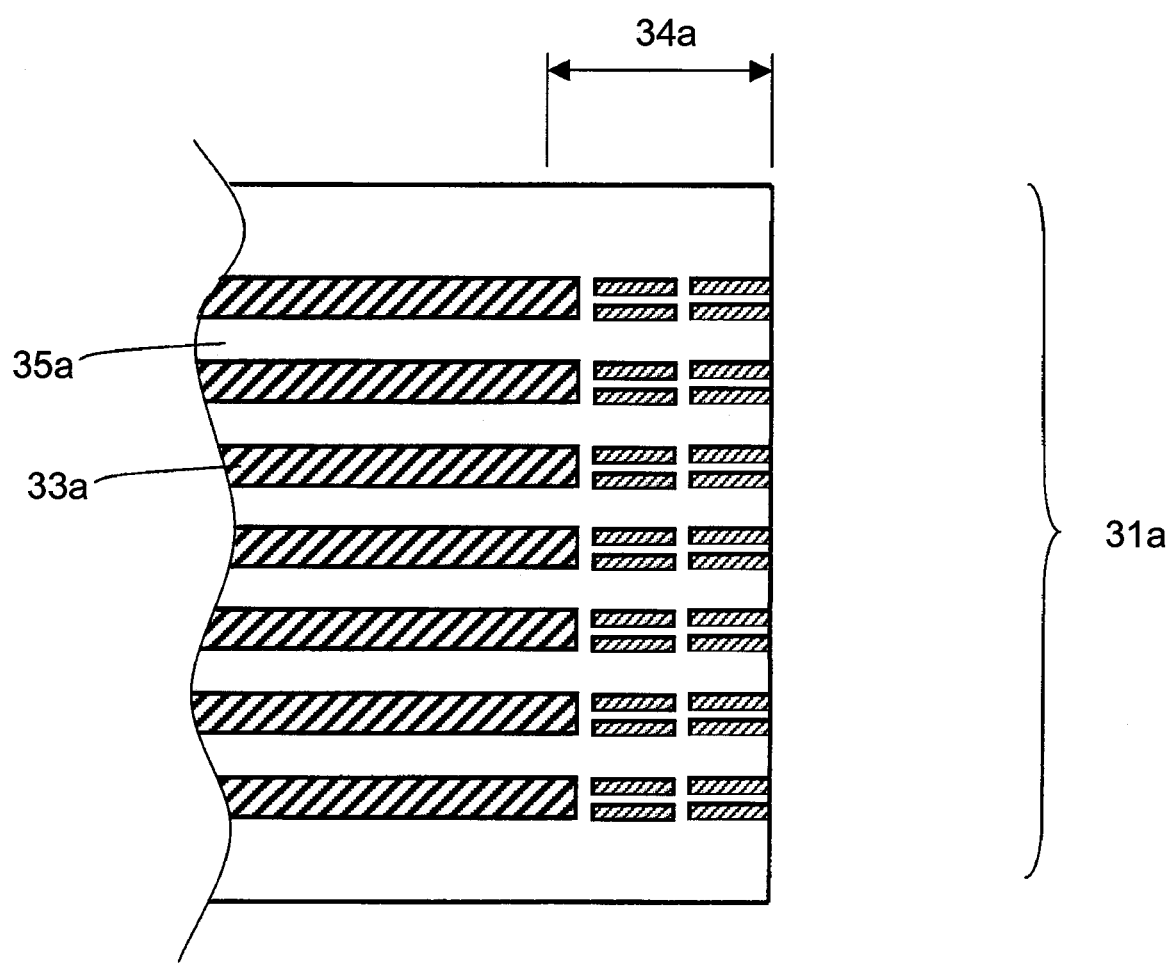
FIG. 13 is the other configuration diagram of a wiring board used in a wiring board connection method according to the present invention.
Figure 14:
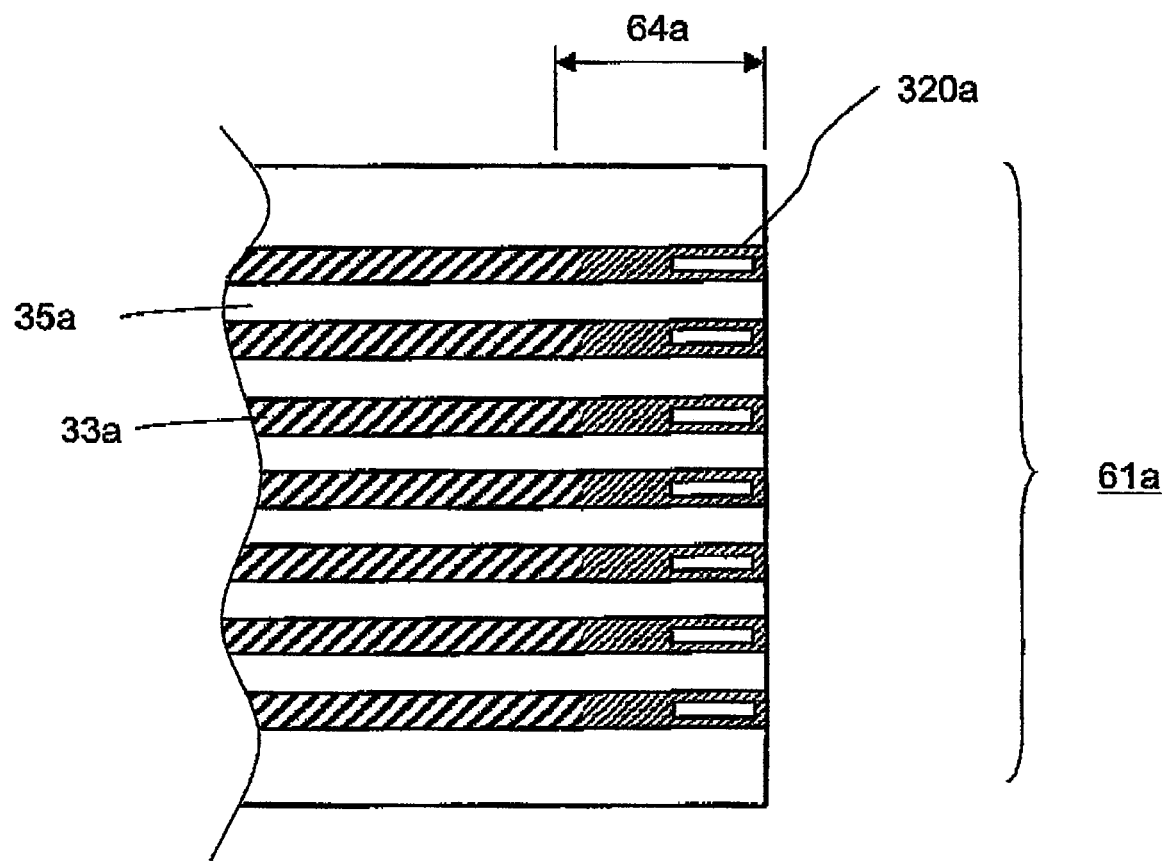
FIG. 14 is the other configuration diagram of a wiring board used in a wiring board connection method according to the present invention.

Although in each of the embodiments, the grooves have been described as being provided perpendicular to the strip-shaped connection terminals, they may be provided obliquely as shown in FIG. 11. Also, although the grooves are described as being formed at equal spaces, they may be formed at unequal spaces as shown in FIG. 12. Furthermore, a plurality of the grooves intersecting each other may be provided as shown in FIG. 13.

In brief, the grooves according to the present invention are not limited by their specific shape or arraignment as far as they have a configuration of extending across the connection terminal so that spaces between the respective connection terminals are able to be communicatively connected to the outside.

Also, although in each of the above embodiments, the description has been made that grooves are provided in every connection terminal in each of the wiring boards, a configuration in which grooves are provided in only at least some of connection terminals may be employed. The grooves according to the present invention are not limited by the number of grooves arranged in each connection terminal as far as they can create a state in which the spaces between the respective connection terminals can be communicatively connected to the outside or are the equivalent of being communicatively connected to the outside.

Figure 15:
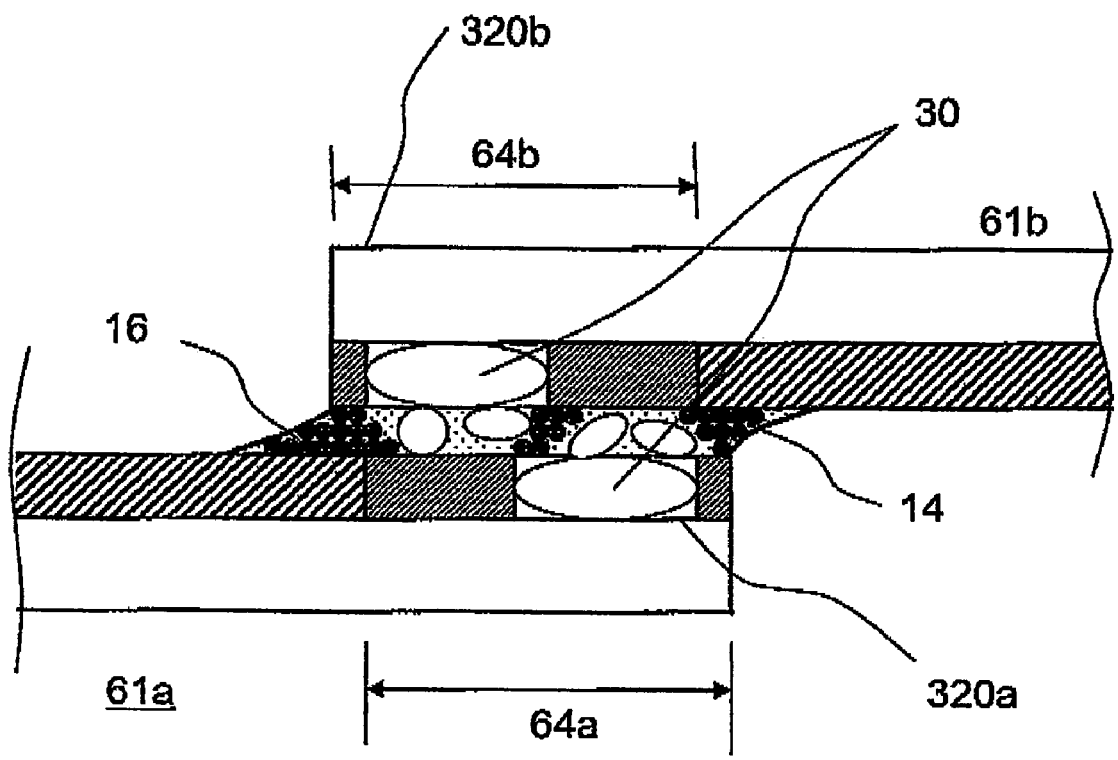
FIG. 15 is a cross-sectional view of for describing the other example of a wiring board connection method according to of the present invention.
Figure 16A:
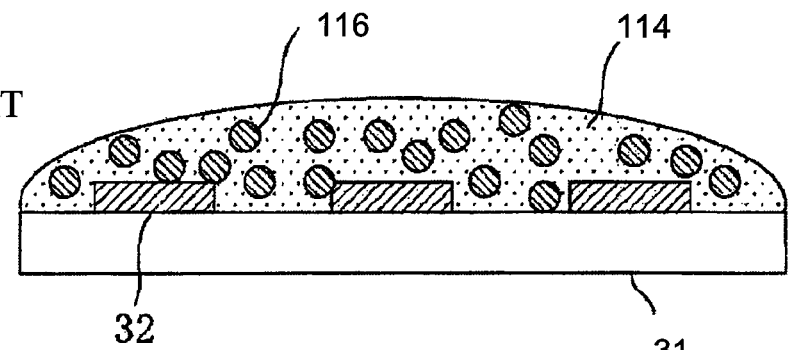
FIG. 16(A) is a cross-sectional view indicating a basic process for a bump formation method utilizing self-gathering of a resin.
Figure 16B:
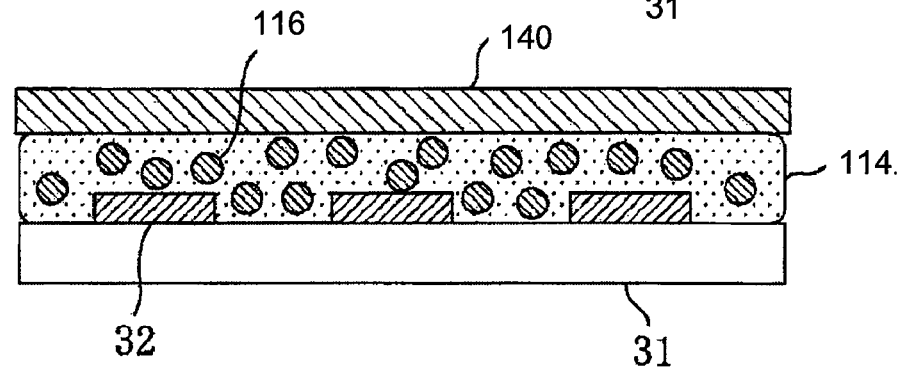
FIG. 16(B) is a cross-sectional view indicating a basic process for a bump formation method utilizing self-gathering of a resin.
Figure 16C:
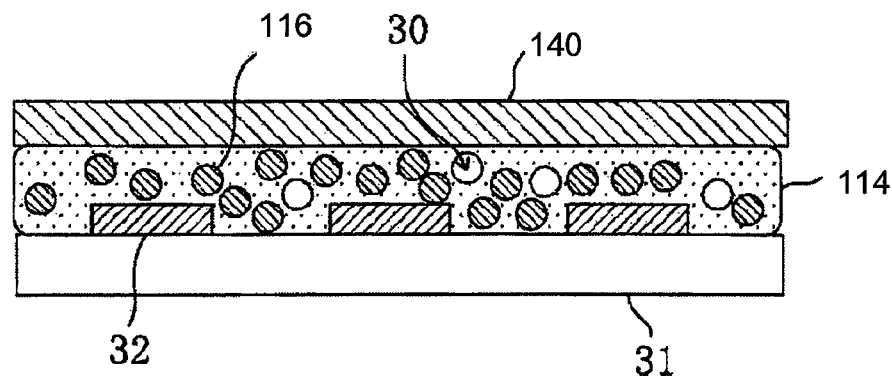
FIG. 16(C) is a cross-sectional view indicating a basic process for a bump formation method utilizing self-gathering of a resin.
Figure 16D:
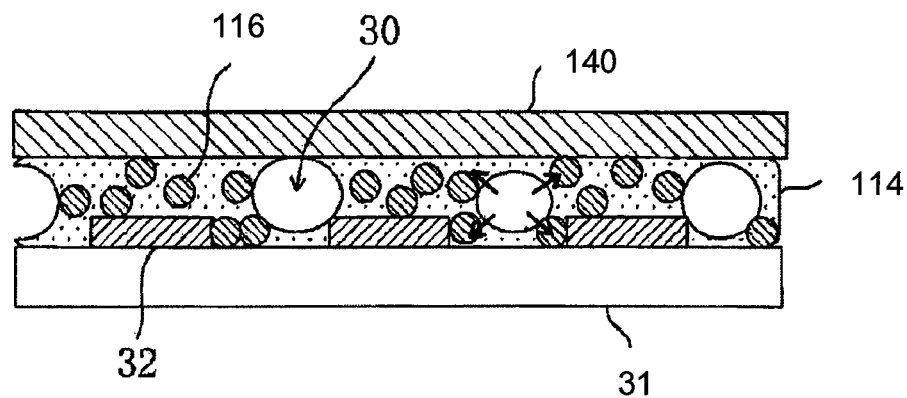
FIG. 16(D) is a cross-sectional view indicating a basic process for a bump formation method utilizing self-gathering of a resin.
Figure 17A:
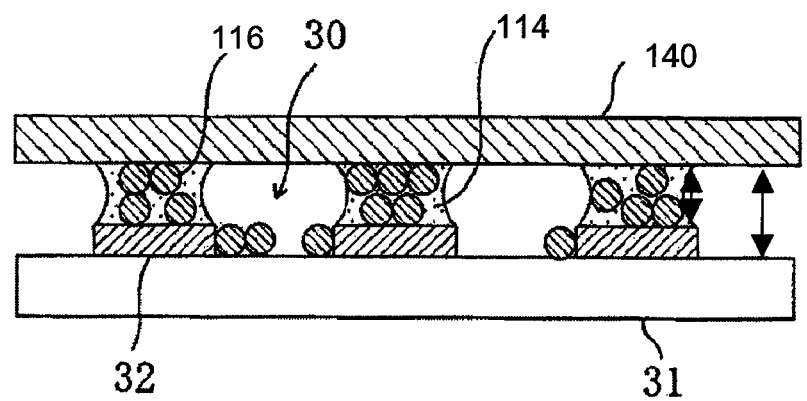
FIG. 17(A) is a cross-sectional view indicating a basic process for a bump formation method utilizing self-gathering of a resin.
Figure 17B:
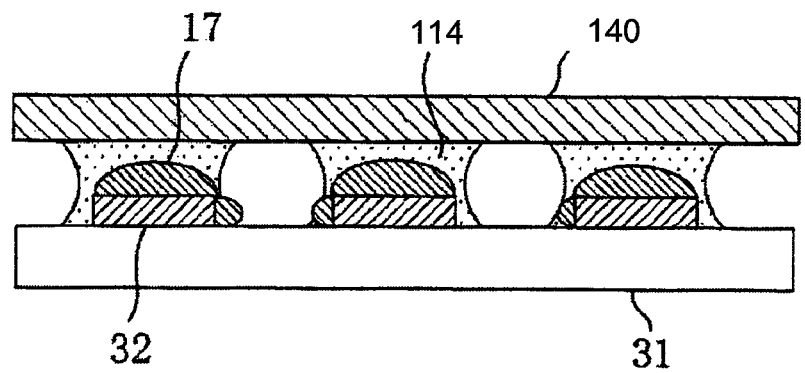
FIG. 17(B) is a cross-sectional view indicating a basic process for a bump formation method utilizing self-gathering of a resin.
Figure 17C:
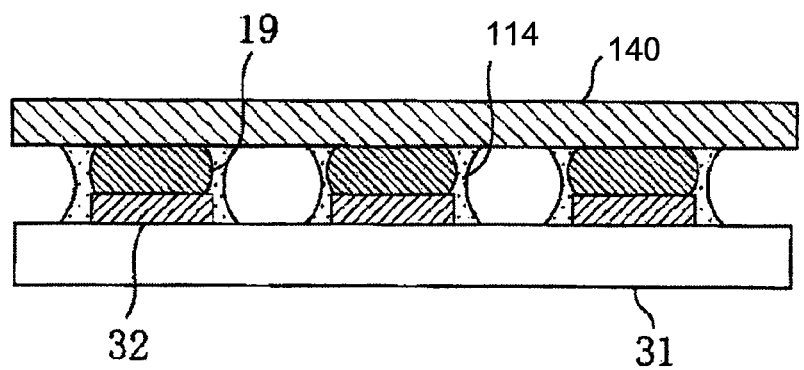
FIG. 17(C) is a cross-sectional view indicating a basic process for a bump formation method utilizing self-gathering of a resin.
Figure 17D:
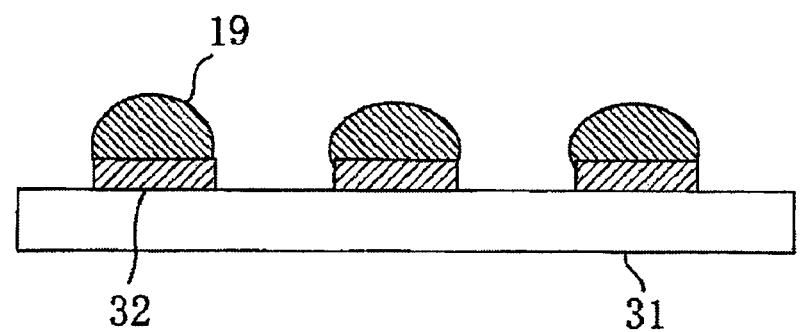
FIG. 17(D) is a cross-sectional view indicating a basic process for a bump formation method utilizing self-gathering of a resin.

Furthermore, although in each of the above embodiments, the description has been made that grooves are provided in every connection terminal in each of the wiring boards, a configuration in which instead of the grooves, recessed portions on the connection terminal which is not communicatively connected to the outside are provided may be employed. FIG. 15 is a plan view of a wiring board having such a configuration.

As shown in FIG. 15, a wiring board 61a is characterized in that each connection terminal 64a have a through-hole 320a on an edge of a wiring line 33a. The through-hole 320a is opened by the depth of reaching the surface of wiring board as well as the connection terminal 34a of the embodiment 1.

The wiring board connection method by use of such a configuration is as follows: As shown in FIG. 16, a second wiring board 61b, which is the connection target, is arranged on the wiring board 61a via the fluid 14. by the same manner as that of the embodiment 1. The second wiring board 61b has the same shape as that of the first wiring board 61a, and also has connection terminals 64b having the same dimensions and shape as those of the connection terminals 64a.

The aforementioned alignment results in a configuration in which the through-hole 320a and the through-hole 320b forms a space with the fluid 14 interposed therebetween.

Heating the area including the connection terminals 64a and 64b in the state shown in FIG. 16, air bubbles 30 generated from the air bubble generating agent contained in the fluid 14 grows and tries to move around within in the fluid 14. However the air bubbles 30 are filled within a space formed of the through-hole 320a and the through-hole 320b.

The air bubbles 30 not filled in the aforementioned space moves in the fluid 14 and gathers in the shape of columns on its interface with the connection terminals 64a and 64b. Concurrently, the conductive particles 16 in the fluid 14 assemble on the connection terminals 64a and 64b.

The subsequent operation is the same as that of the embodiment 1: Further heating the fluid 14, the conductive particles 16 contained in the fluid 14 are molten, and as a result, the self-assembly of the conductive particles 16 is completed. In other words, the connection terminals 64a and 64b are connected via the conductive particles molten therebetween, and the molten conductive particles are solidified by cooling them. As a result, the connection terminals 64a and 64b are completely connected.

In the aforementioned operation, an excessive growing or moving of the air bubbles is suppressed by filling them within the space formed of the through-holes 320a and 320b.

For these reasons, the amount of fluid 14 leaking to the outside is reduced, and a large part of fluid 14 self-gathers on the surfaces of the connection terminals 64a and 64b along with the growth or movement of the air bubbles. Accordingly, the problems of adjacent wiring line and connection terminal short-circuiting and unconnected connection terminals, etc., can be solved to some extent. This configuration is expected to be more effective in the case that the width of the electrodes is far wider than that of the embodiments 1 to 4.

In the aforementioned configuration, the through-holes 320a and 320b correspond to the recess portions according to the present invention. Also, although the through-hole 320a is described as having a depth reaching a surface of the wiring board, the recess portion according to the present invention may be formed by a depth not reaching a surface of the wiring board, as well as the embodiment 2. Also, the recess portion according to the present invention is not limited by its specific shape, numbers or way of arrangement.

Also, although in each of the above embodiments, the description has been made focusing on a wiring board connection method according to the present invention, the wiring boards used in that method are also included in the present invention.

A wiring board connection method, etc., according to the present invention has the effect of enabling connection terminals to be connected in a favorable manner, and is useful as, for example, a wiring board connection method for electrically connecting a wiring board and a wiring board, and a wiring board used therein.

What is claimed is:

1. A wiring board connection method which connects wiring boards each having a strip-shaped connection terminal for connecting with another substrate, the method comprising:
   arranging a continuous conductive joint body (i) on adjacent connection terminals of one of the wiring boards, and (ii) in a space between the adjacent connection terminals on the one of the wiring boards;
   aligning the wiring boards so that the connection terminals face each other with the conductive joint body interposed therebetween; and
   bonding the connection terminals with each other by heating and then cooling the conductive joint body, wherein:
   the conductive joint body is a material that generates air bubbles upon being heated;
   a plurality of the connection terminals are provided in each of the wiring boards;
   a recessed portion is formed on a surface of at least one of the connection terminals in at least one of the wiring boards, the surface being opposite to the connection terminal of another wiring board; and
   when the connection terminals are bonded with each other, the conductive joint body is allowed to move so as to gather on the surfaces of the connection terminals where no recessed portions are formed.

2. The wiring board connection method according to claim 1, wherein, the recessed portion is formed as a groove.

3. The wiring board connection method according to claim 2, wherein, the groove is formed extending across the connection terminal.

4. The wiring board connection method according to claim 3, wherein:
   the groove has a depth reaching a surface of the wiring board; and
   the connection terminal is separated by the groove and is intermittently formed on the surface of the wiring board.

5. The wiring board connection method according to claim 3, wherein:
   the groove has a depth not reaching a surface of the wiring board; and
   the connection terminal is continuously formed on the surface of the wiring board.

6. The wiring board connection method according to claim 3, wherein:

the groove is provided perpendicular to a longitudinal direction of the connection terminal; and in the aligned state, the groove in one of the opposing connection terminals and a part of the other of the opposing connection terminals in which the groove is not formed face each other.

7. The wiring board connection method according to claim 6, wherein:

the groove is formed in each of the opposing connection terminals;

the groove is provided on each of the connection terminals at equal spaces; and in the aligned state, a center line of at least one of the grooves in one of the opposing connection terminals and a center line of the part of the other of the opposing connection terminals interposed between at least two of the grooves correspond to each other.

8. The wiring board connection method according to claim 6, wherein, a width of the groove is shorter than a length of the part of the other connection terminal.

9. The wiring board connection method according to claim 7, wherein, a width of the groove is shorter than a length of the part of the other connection terminal.

10. The wiring board connection method according to claim 1, wherein:

the conductive joint body is a fluid containing conductive particles and an air bubble generating agent; and the fluid contains a material that generates a gas as a result of boiling or thermally decomposing upon being heated.

11. The wiring board connection method according to claim 10, wherein the alignment is conducted with a space between the wiring boards, the space being larger than a diameter of the conductive particles in the conductive joint body.

12. The wiring board connection method according to claim 1, wherein the conductive joint body is an anisotropic conductive material.

* * * * *